US011086159B2

United States Patent
Kim et al.

(10) Patent No.: US 11,086,159 B2
(45) Date of Patent: Aug. 10, 2021

(54) ELECTRONIC DEVICE PROVIDED WITH INPUT DETECTION PANEL

(71) Applicant: Samsung Electronics Co., Ltd., Gyeonggi-do (KR)

(72) Inventors: Jin-Man Kim, Gyeongsangbuk-do (KR); Hyun-Chul Oh, Gyeongsangbuk-do (KR); Joon Gyu Lee, Gyeonggi-do (KR); Ju-Hee Han, Gyeonggi-do (KR); Kyungok Jang, Daegu (KR); Ji-Woo Lee, Gyeongsangbuk-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/321,302

(22) PCT Filed: Jun. 21, 2017

(86) PCT No.: PCT/KR2017/006507
§ 371 (c)(1),
(2) Date: Jan. 28, 2019

(87) PCT Pub. No.: WO2018/021694
PCT Pub. Date: Feb. 1, 2018

(65) Prior Publication Data
US 2019/0163003 A1 May 30, 2019

(30) Foreign Application Priority Data
Jul. 29, 2016 (KR) .......................... 10-2016-0096876

(51) Int. Cl.
*G06F 3/041* (2006.01)
*G02F 1/1333* (2006.01)
(Continued)

(52) U.S. Cl.
CPC ........ *G02F 1/13338* (2013.01); *G02F 1/1333* (2013.01); *G02F 1/133305* (2013.01);
(Continued)

(58) Field of Classification Search
CPC ...................................................... G06F 3/041
See application file for complete search history.

(56) References Cited

U.S. PATENT DOCUMENTS

2007/0085837 A1  4/2007 Ricks et al.
2011/0248940 A1  10/2011 Chuang et al.
(Continued)

FOREIGN PATENT DOCUMENTS

KR  1020130038752  4/2013
KR  1020130100950  9/2013
(Continued)

OTHER PUBLICATIONS

European Search Report dated Jun. 6, 2019 issued in counterpart application No. 17834637.5-1231, 8 pages.
(Continued)

*Primary Examiner* — Roy P Rabindranath
(74) *Attorney, Agent, or Firm* — The Farrell Law Firm, P.C.

(57) ABSTRACT

An electronic device according to various embodiments of the present disclosure may include: a housing having first and second faces opposite to each other; a transparent substrate disposed on the first face of the housing; a display panel disposed below the transparent substrate; and an input sensing panel disposed below the display panel. The input sensing panel may include: a plurality of conductive patterns; and dummy patterns each disposed between each of the conductive patterns. Other various embodiments are also possible.

11 Claims, 25 Drawing Sheets

(51) Int. Cl.
  *H01L 27/32* (2006.01)
  *H05K 1/02* (2006.01)
(52) U.S. Cl.
  CPC ........ *G02F 1/133308* (2013.01); *G06F 3/041* (2013.01); *G06F 3/0412* (2013.01); *H01L 27/32* (2013.01); *H01L 27/3211* (2013.01); *H05K 1/02* (2013.01); *H05K 1/028* (2013.01)

(56) References Cited

U.S. PATENT DOCUMENTS

| | | |
|---|---|---|
| 2011/0279385 A1 | 11/2011 | Chang et al. |
| 2012/0092259 A1 | 4/2012 | Liu et al. |
| 2013/0088453 A1 | 4/2013 | Park et al. |
| 2013/0168138 A1 | 7/2013 | Yamazaki et al. |
| 2013/0234734 A1 | 9/2013 | Iida et al. |
| 2013/0278556 A1 | 10/2013 | Conway et al. |
| 2014/0001018 A1* | 1/2014 | Lee .................. H01H 1/06 200/275 |
| 2014/0035849 A1* | 2/2014 | Jung ................ G06F 3/041 345/173 |
| 2014/0085216 A1 | 3/2014 | Cok |
| 2014/0118641 A1* | 5/2014 | Ryu ................. G06F 1/1692 349/12 |
| 2014/0153213 A1* | 6/2014 | Oh .................... F21V 7/00 362/19 |
| 2014/0184560 A1* | 7/2014 | Adachi ............. G06F 3/0412 345/174 |
| 2014/0240622 A1 | 8/2014 | Watazu et al. |
| 2015/0083568 A1* | 3/2015 | Park .................. G06F 3/0443 200/600 |
| 2015/0138139 A1 | 5/2015 | Tokuno et al. |
| 2015/0234430 A1 | 8/2015 | Gupta et al. |
| 2015/0324024 A1 | 11/2015 | Hwang et al. |
| 2016/0062516 A1 | 3/2016 | Jeong et al. |
| 2016/0062537 A1* | 3/2016 | Kim ................. G06F 3/0445 345/174 |
| 2016/0092030 A1 | 3/2016 | Byun et al. |
| 2016/0106012 A1* | 4/2016 | Jang ................. H05K 9/0086 361/679.26 |
| 2016/0139728 A1* | 5/2016 | Jeon ................. G06F 3/044 345/173 |
| 2016/0236975 A1* | 8/2016 | Sugimoto ............ C03C 3/083 |

FOREIGN PATENT DOCUMENTS

| | | |
|---|---|---|
| KR | 1020140070490 | 6/2014 |
| KR | 1020150056960 | 5/2015 |
| KR | 1020160027679 | 3/2016 |
| KR | 1020160057573 | 5/2016 |

OTHER PUBLICATIONS

PCT/ISA/210 Search Report issued on PCT/KR2017/006507 (pp. 5).
PCT/ISA/237 Written Opinion issued on PCT/KR2017/006507 (pp. 8).
European Search Report dated May 21, 2021 issued in counterpart application No. 17834637.5-1231, 7 pages.

* cited by examiner

ELECTRONIC DEVICE PROVIDED WITH INPUT DETECTION PANEL

PRIORITY

This application is a National Phase Entry of International Application No. PCT/KR2017/006507, which was filed on Jun. 21, 2017, and claims priority to Korean Patent Application No. 10-2016-0096876, which was filed on Jul. 29, 2016, the contents of each of which are incorporated herein by reference.

TECHNICAL FIELD

Various embodiments of the present disclosure relate to an electronic device with an input sensing panel such as a pressure sensor or a digitizer.

BACKGROUND ART

An electronic device may have at least one or more input sensing panels mounted as a data input device. For example, the input sensing panel may include a touch screen panel, a digitizer panel, or the like.

The digitizer panel or the like may be used as an input device of the electronic device by being mounted integrally on a display panel through a high-pressure pressing process.

DISCLOSURE OF INVENTION

Technical Problem

However, when the display panel and the input sensing panel are pressed at a high pressure during a process of assembling the electronic device, a lower face of the display panel and an upper face of the input sensing panel may be strongly adhered to each other. Therefore, a pattern of a concavo-convex shape may appear in the display panel.

Due to the concavo-convex shape, when the display panel having a high transmittance is seen under bright illumination, a pattern of at least one or more concavo-convex shapes (a contrast pattern) may appear on a surface of the display panel.

In addition, the electronic device is constructed in a structure in which a copper sheet is mounted on a lower face of the input sensing panel to protect the input sensing panel such as the display panel and the digitizer from a noise signal, static electricity, or the like.

However, the noise signal may flow through the copper sheet when the electronic device is charged in a wired manner, which may lead to a damage in a display driver Integrated Circuit (IC) chip or the like.

Various embodiments of the present disclosure may provide an electronic device in which a concavo-convex shape (a contrast) does not appear on a display area when a display module is seen under illumination.

In addition, various embodiments of the present disclosure may provide an electronic device which cuts off an electrical path through which a noise signal generated in a charging process flows to a display chip mounted on a display flexible circuit board, and which grounds the flowing electrical noise.

Solution to Problem

Various embodiments of the present disclosure may provide an electronic device including: a housing having first and second faces opposite to each other; a transparent substrate disposed on the first face of the housing; a display panel disposed below the transparent substrate; and an input sensing panel disposed below the display panel. The input sensing panel may include: a plurality of conductive patterns; and dummy patterns each disposed between each of the conductive patterns.

Advantageous Effects of Invention

According to various embodiments of the present disclosure, a concavo-convex shape (a contrast) may not appear on an activating area of a display, when a display module of an electronic device is seen under bright illumination.

In addition, according to various embodiments of the present disclosure, it is possible to cut off an electrical path through which a noise signal generated when an electronic device is charged in a wired manner flows to a display chip mounted on a display flexible circuit board.

BEST MODE FOR CARRYING OUT THE INVENTION

Figure 1A:
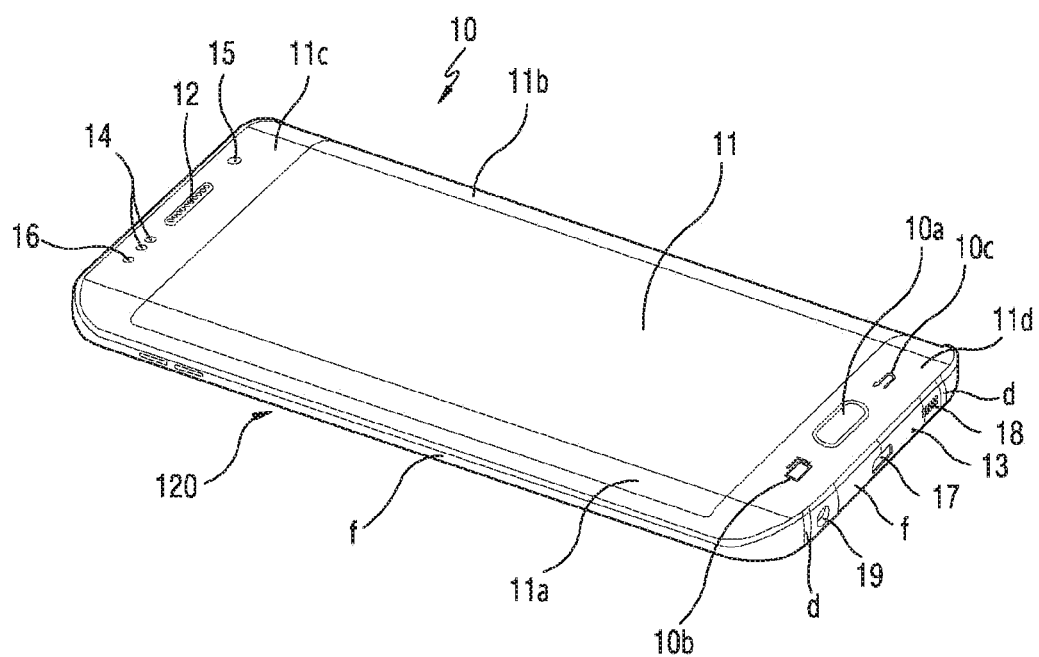
FIG. 1A is a perspective view illustrating a front face of an electronic device according to various embodiments.

Hereinafter, various embodiments of the present invention will be described with reference to accompanying drawings. However, various embodiments of the present invention are not limited to specific embodiments, and it should be understood that modification, equivalent, and/or alternative on the various embodiments described herein can be variously made. With regard to description of drawings, similar components may be marked by similar reference numerals.

In the disclosure disclosed herein, the expressions "have," "may have," "include" and "comprise," or "may include" and "may comprise" used herein indicate existence of corresponding features (for example, elements such as numeric values, functions, operations, or components) and do not preclude the presence of additional features.

In the disclosure disclosed herein, the expressions "A or B," "at least one of A or/and B," or "one or more of A or/and B," and the like used herein may include any and all combinations of one or more of the associated listed items. For example, the term "A or B," "at least one of A and B," or "at least one of A or B" may refer to all of the case (1) where at least one A is included, the case (2) where at least one B is included, or the case (3) where both of at least one A and at least one B are included.

The terms, such as "first," "second," and the like used herein, may refer to various elements of various embodiments of the present invention, but do not limit the elements. For example, such terms do not limit the order and/or priority of the elements. Furthermore, such terms may be used to distinguish one element from another element. For example, "a first user device" and "a second user device" indicate different user devices regardless of the order or priority. For example, without departing from the scope of the present invention, a first element may be referred to as a second element, and similarly, a second element may be referred to as a first element.

It will be understood that when an element (for example, a first element) is referred to as being "(operatively or communicatively) coupled with/to" or "connected to" another element (for example, a second element), it can be directly coupled with/to or connected to another element or coupled with/to or connected to another element via an intervening element (for example, a third element). In contrast, when an element (for example, a first element) is referred to as being "directly coupled with/to" or "directly connected to" another element (for example, a second element), it should be understood that there is no intervening element (for example, a third element).

According to the situation, the expression "configured to (or set to)" used herein may be used as, for example, the expression "suitable for," "having the capacity to," "designed to," "adapted to," "made to," or "capable of". The term "configured to (or set to)" must not mean only "specifically designed to" in hardware. Instead, the expression "a device configured to" may mean that the device is "capable" of operating together with another device or other components. For example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in the present invention are used to describe specified embodiments of the present invention and are not intended to limit the scope of other embodiments. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal way, unless expressly so defined herein in various embodiments of the present invention. In some cases, even if terms are terms which are defined in the specification, they may not be interpreted to exclude embodiments of the present invention.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices (for example, smart glasses, head-mounted-devices (HMDs), electronic apparels, electronic bracelets, electronic necklaces, electronic appcessory, electronic tattoos, smart mirrors, or smart watches).

According to certain embodiments, the electronic devices may be smart home appliances. The smart home appliances may include at least one of, for example, televisions (TVs), digital video disk (DVD) players, audios, refrigerators, air conditioners, cleaners, ovens, microwave ovens, washing machines, air cleaners, set-top boxes, home automation control panels, security control panels, TV boxes (for example, Samsung HomeSync™, Apple TV™, or Google TV™), game consoles (for example, Xbox™ and PlayStation™), electronic dictionaries, electronic keys, camcorders, electronic picture frames, and the like.

According to another embodiment, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation electronic devices, global positioning system receivers (GPSs), event data recorders (EDRs), flight data recorders (FDRs), vehicle infotainment devices, electronic equipment for vessels (for example, navigation systems and gyrocompasses), avionics, security devices, head units for vehicles, industrial or home robots, automatic teller's machines (ATMs) of financial institutions, points of sales (POSs) of stores, or internet of things (for example, light bulbs, various sensors, electric or gas meters, sprinkler devices, fire alarms, thermostats, street lamps, toasters, exercise equipment, hot water tanks, heaters, boilers, and the like).

According to a certain embodiment, the electronic devices may include at least one of a part of furniture or buildings/structures, electronic boards, electronic signature receiving devices, projectors, or various measuring instruments (for example, water meters, electricity meters, gas meters, or wave meters, and the like). The electronic devices according to various embodiments may be one or more combinations of the above-mentioned devices. According to a certain embodiment, an electronic device may be a flexible electronic device. Also, electronic devices according to various embodiments of the present disclosure are not limited to the above-mentioned devices, and may include new electronic devices according to technology development.

Figure 1B:
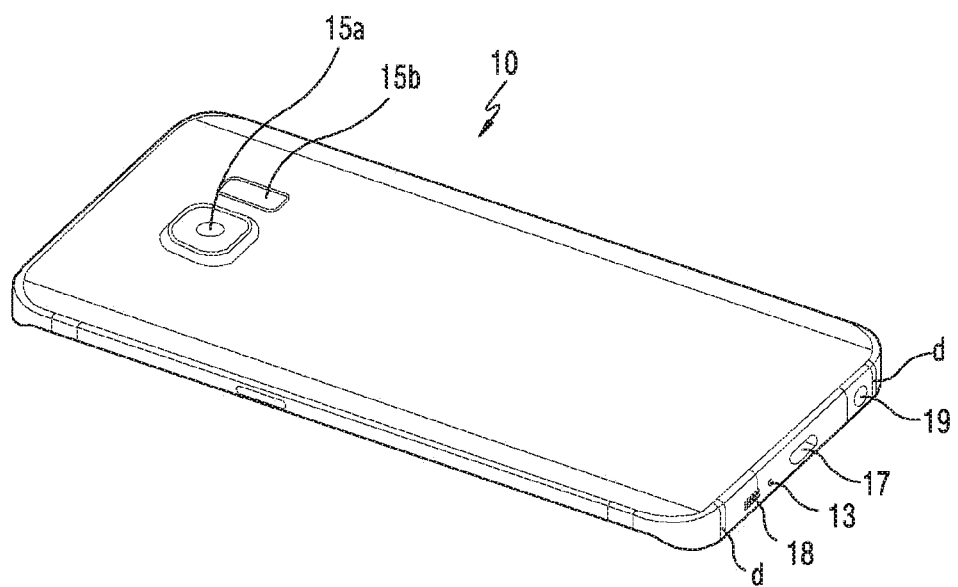
FIG. 1B is a perspective view illustrating a rear face of the electronic device according to various embodiments.

FIG. 1A is a perspective view illustrating a front face of an electronic device according to various embodiments, and FIG. 1B is a perspective view illustrating a rear face of the electronic device according to various embodiments.

Referring to FIG. 1A and FIG. 1B, an electronic device 10 according to various embodiments may have a display 11 (alternatively, referred to as a touch screen) installed on a front face. A receiver 12 for receiving a voice of a peer user may be disposed to an upper portion of the display 11. A microphone 13 for transmitting a voice of a user of the electronic device to the peer user may be disposed to a lower side of the display 11.

The electronic device 10 according to various embodiments may have components disposed to perform various functions of the electronic device 10 in a surrounding area where the receiver 12 is installed. The components may include at least one sensor module 14. The sensor module 14 may include, for example, at least one of an illumination sensor (e.g., a light sensor), a proximity sensor (e.g., a light sensor), an infrared sensor, and an ultrasonic sensor. According to an embodiment, the component may include a front camera 15. According to an embodiment, the component may include an indicator 16 for informing the user of status information of the electronic device 10.

The display 11 according to various embodiments may be constructed as a large screen to occupy most of the front face of the electronic device 10. For example, the display of the electronic device may be constructed of a flat display, a curved display with a curvature, or a face in which a flat face and a curved face are combined.

The display 11 according to various embodiments may include the flat display and the curved display. The curved display may be disposed to an edge of the flat display. The curved display may be disposed to both edges 11a and 11b of the flat display. In addition, upper and lower regions 11c and 11d of the flat display are not necessarily limited to the flat display, and thus may be constructed of the curved display.

A main home screen is a first screen displayed on the display 11 when the electronic device 10 is powered on. In addition, if the electronic device 10 has different home screens of several pages, the main home screen may be a first home screen among the home screens of several pages. Shortcut icons for executing frequently used applications, a main menu switching key, time, weather, and the like may be displayed on the home screen. The main menu switching key may display a menu screen on the display 11. In addition, a status bar may be located in an upper end of the display 11 to indicate a status of the device 10 such as a battery charging status, received signal strength, and a current time. A home key 10a, a menu key 10b, and a back key 10c may be located in a lower portion of the display 11.

The home key 10a according to various embodiments may display the main home screen on the display 11. For example, when the home key 10a is touched in a state where a home screen different from the main home screen is displayed or, alternatively, the menu screen is displayed on the display 11, the main home screen may be displayed on the display 11. Further, when the home key 10a is touched while applications are running on the display 11, the main home screen may be displayed on the display 11. In addition, the home key 10a may be used to display recently used applications on the display 11, or to display a task manager. The home key 10a may be deleted from a front portion of the electronic device 10. A fingerprint recognition sensor device may be disposed to an upper face of the home key 10a. The home key may contribute to a first function (a home screen return function, a wake-up/sleep function, etc.) performed by a physically pushing operation and a second function (e.g., a fingerprint recognition function, etc.) performed by an operation of swiping the upper face of the home key.

The menu key 10b according to various embodiments may provide a link menu which can be used on the display 11. For example, the link menu may include a widget add menu, a background change menu, a search menu, an edit menu, an environment setup menu, or the like. The back key 10c according to various embodiments may display a screen executed immediately before the currently running screen, or may finish a most recently used application.

The electronic device 10 according to various embodiments may include a metal frame 'f' as a housing. The housing according to various embodiments may include a first face facing a first direction, a second face facing a second direction opposite to the first direction, and a side face surrounding a space between the first face and the second face.

The metal frame 'f' may be disposed along a boundary of the electronic device 10, and may be displayed by being extended up to at least part of the rear face of the electronic device 10 extended from the boundary. The metal frame 'f' may be at least part of a thickness of the electronic device 10 along the boundary of the electronic device, and may be constructed in a segmental structure.

The metal frame 'f' according to various embodiments may be disposed only to at least part of the boundary of the electronic device 10. When the metal frame 'f' is a portion of the housing of the electronic device 10, the remaining portions of the housing may be replaced by a non-metallic member. In this case, the housing may be constructed in such a manner that the non-metallic member is insert-injected to the metal frame T. The metal frame 'f' may include at least one segment portion 'd' so that a unit metal frame separated by the segment portion d is utilized as an antenna radiator. An upper frame may be a unit frame separated by a pair of segment portions (not shown) disposed with a specific interval. A lower frame may be a unit frame separated by a pair of segment portions 'd' disposed with a specific interval. The segment portions 'd' may be disposed together when the non-metal member is insert-injected to the metal member.

Various electronic components may be disposed to the metal frame 'f' according to various embodiments. A speaker 18 may be disposed to one side of the microphone 13. An interface connector 17 may be disposed to the other side of the microphone 13 to charge the electronic device 10 by using a data transmission/reception function provided by an external device or by receiving external power. An ear jack hole 19 may be disposed to one side of the interface connector 17. The aforementioned microphone 13, speaker 18, interface connector 17, and ear jack hole 19 may be disposed within a region of a unit frame separated by the pair of segment portions 'd' disposed to the lower metal frame T. However, the present disclosure is not limited thereto, and thus at least one of the aforementioned electronic components may be disposed to a region including the segment portion 'd', or may be disposed outside the unit frame.

At least one side key button may be disposed to the left metal frame 'f' according to various embodiments. The at least one side key button may be disposed to the left metal frame 'f' in such a manner that one portion thereof protrudes in pair to perform a volume up/down function, a scroll function, or the like. At least one different side key button may be disposed to the right metal frame 'f' according to various embodiments. A second side key button 112 may perform a power on/off function, a wake-up/sleep function of the electronic device, or the like.

A rear camera 15a may be disposed to a rear face of the electronic device 10 according to various embodiments, and at least one electronic component 15b may be disposed to one side of the rear camera 15a. For example, the electronic component 15b may include at least one of an illumination sensor (e.g., a light sensor), a proximity sensor (e.g., a light sensor), an infrared sensor, an ultrasonic sensor, a heart rate sensor, and a flash device.

The display 11 according to various embodiments may include the left curved portion 11a and right curved portion 11b which are constructed respectively on left and right sides. The front face of the electronic device 10 may include a display area and other areas by using one window. The left and right curved portions 11a and 11b may be extended from a planar portion in a vertical direction of the electronic device 10. The left and right curved portions 11a and 11b may be side faces of the electronic device 10. In this case, the left and right curved portions 11a and 11b and the left and right frames of the metal frame 'f' may be side faces of the electronic device 10 together. However, the present disclosure is not limited thereto, and thus the front face including the display 11 may include only at least one of the left and right curved portions.

The electronic device 10 according to various embodiments may control a display module so that information is selectively displayed. The electronic device 10 may control the display module to configure a screen only on the planar portion. The electronic device 10 may control the display module to configure the screen by including any one of the left and right curved portions 11a and 11b together with the planar portion. The electronic device 10 may control the display module to configure the screen by using only at least one curved portion of the left and right curved portions except for the planar portion.

The rear face of the electronic device 10 according to various embodiments may be constructed generally by means of at least one rear exterior surface mounting member. The rear face may include a planar portion disposed substantially around a center, and additionally may include, or not include, a left curved portion and a right curved portion at both left/right sides of the planar portion.

Figure 2:
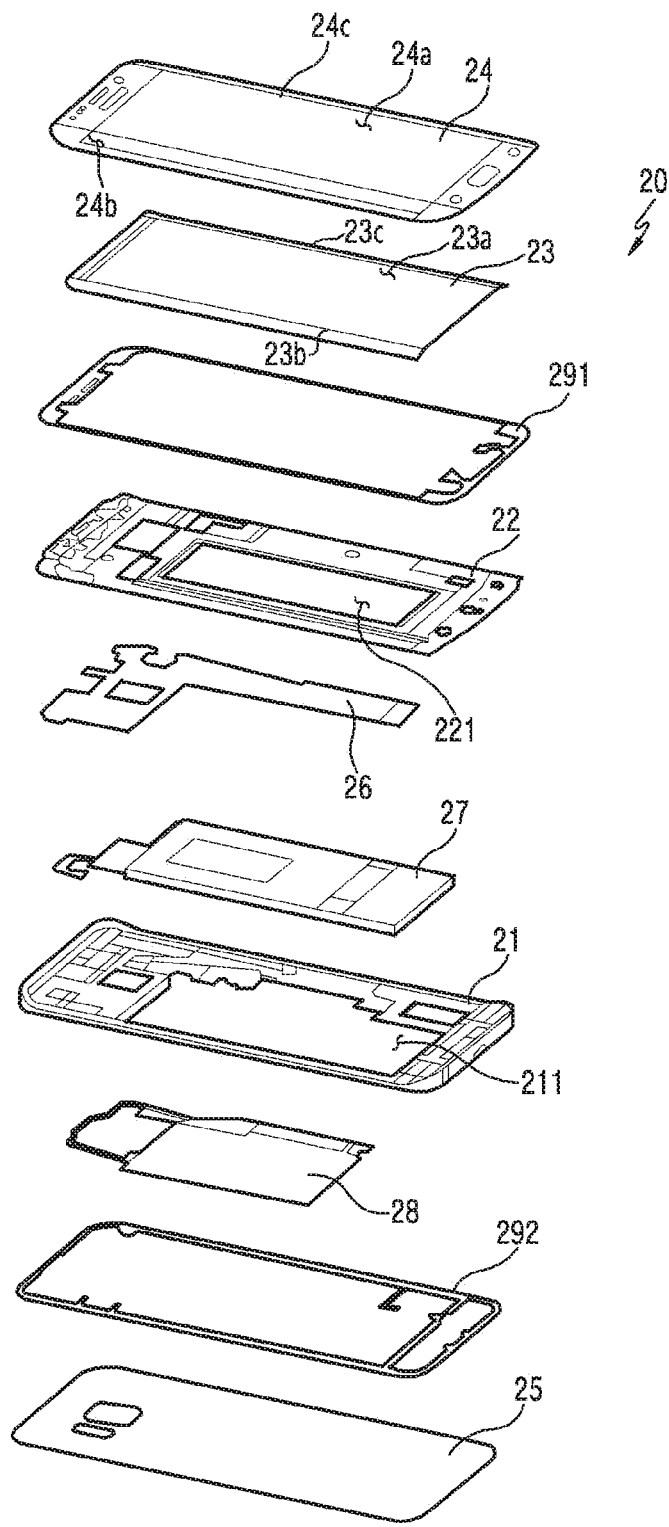
FIG. 2 is an exploded perspective view illustrating an inner configuration of an electronic device according to various embodiments.

FIG. 2 is an exploded perspective view illustrating a configuration of an electronic device 20 according to various embodiments. The electronic device 20 according to various embodiments may be the same as or partially the same as the aforementioned electronic device 10.

Referring to FIG. 2, the electronic device 20 according to various embodiments may be disposed in such a manner that a Printed Circuit Board (PCB) 26, an inner support structure 22, a display module 23 (also referred to as a display layer), and a front window 24 (also referred to as a first plate facing substantially a first direction or a transparent plate) are sequentially laminated above a housing 21. The front window 24 may construct at least part of a first face of the housing, and may be constructed of a substantially transparent material.

The electronic device 20 according to various embodiments may be disposed in such a manner that a wireless power transmitting/receiving member 28 (which may include a flexible printed circuit board having an antenna pattern) and a rear window 25 (also referred to as a second plate facing substantially a second direction opposite to the first direction) are sequentially laminated below the housing 21.

A battery pack 27 according to various embodiments may be accommodated in an accommodation space of the battery pack 27 disposed to the housing 21 and may be disposed by avoiding the PCB 26. According to an embodiment, the battery pack 27 and the PCB 26 may be disposed in parallel without overlapping with each other.

The display module 23 according to various embodiments may be fixed to the inner support structure 22, and the front window 24 may be fixed in such a manner that it is attached to the inner support structure 22 by means of a first adhesive member 291. The rear window 25 according to various embodiments may be fixed in such a manner that it is attached to the housing 21 by means of a second adhesive member 292. The electronic device according to various embodiments may include a side member which at least partially surrounds a space between the first plate and the second plate. The display module 23 may be disposed between the front window 23 of the housing and the second face of the housing.

The front window 24 according to various embodiments may include a planar portion 24a and a left bending portion 24b and right bending portion 24c which are bent in both directions at the planar portion 24a. For example, the front window 24 located in an upper portion of the electronic device 20 may constitute a front face and display a screen displayed on the display module 23 by using a transparent material, and may provide an input/output window of various sensors. According to an embodiment, although it is illustrated such that the left and right bending portions 24b and 24c have a shape of a 3D-type, it is also possible to apply a shape of not only left and right but also up and down single-refraction type or, alternatively, a shape of up, down, left, and right double-refraction type. According to an embodiment, a touch panel may be further disposed to a rear face of the front window 24, and thus a touch input signal may be received from the outside.

The display module 23 according to various embodiments may have a shape corresponding to the front window 24 (a shape having a corresponding curvature). According to an embodiment, the display module 23 may include left and right bending portions around a planar portion. The display module 23 according to an embodiment may be a flexible display module. According to an embodiment, if the rear face of the front window 24 has a window shape of a planar type (hereinafter, referred to as a 2D type or, alternatively, 2.5D type), since the rear face of the front window 24 is a plane, a normal Liquid Crystal Display (LCD) or, alternatively, an On-Cell Tsp AMOLED (OCTA) may also be applied.

The first adhesive member 291 according to various embodiments is a component for fixing the front window 24 to the inner support structure (e.g., bracket) 22 disposed inside the electronic device, and may be a kind of a tape such as a double-sided tape and a liquid adhesive layer such as a bond. For example, when the double-sided tape is applied as the first adhesive member 291, an internal material may be a general PolyEthylene Terephthalate (PET) material, and a functional material may also be applied. For example, a foam tape or, alternatively, a material using an impact-resistant fabric may be used to strengthen impact resistance, thereby preventing the front window from being damaged by an external impact.

The inner support structure 22 according to various embodiments may be disposed inside the electronic device 20 and used as a component for strengthen overall rigidity of the electronic device. For example, at least one of metallic materials, i.e., Al, Mg, and STS, may be used for the inner support structure 22. According to an embodiment, the inner support structure 22 may be constructed by using highly rigid plastic containing glass fiber, or a may be constructed by using metal and plastic together. According to an embodiment, as a material of the inner support structure 22, when a metal member and a non-metal member are used together, the inner support structure 22 may be constructed in such a manner that the non-metal member is insert-injected to the metal member. The inner support structure 22 may be disposed to a rear face of the display module 23, may have a shape (curvature) similar to that of the rear face of the display module 23, and may support the display module 23. According to an embodiment, an elastic member such as a sponge or a rubber or an adhesive layer such as a double-sided tape or, alternatively, a kind of sheet such as a single-sided tape may be further disposed between the inner support structure 22 and the display module 23 to protect the display module 23.

The electronic device 20 according to various embodiments may be constructed optionally by adding a plate-shaped metallic material or, alternatively, a composite material to a hole region to reinforce internal rigidity, or may further include an auxiliary device to improve a thermal characteristic, an antenna characteristic, or the like.

The inner support structure 22 according to various embodiments may be joined to the housing (e.g., rear case) 21 to provide an inner space in which at least one electronic component can be disposed. The electronic component may include the Printed Circuit Board (PCB) 26. However, the present disclosure is not limited thereto, and thus, in addition to the PCB 26, may include an antenna device, a sound device, a power supply device, a sensor device, or the like.

The battery pack 27 according to various embodiments may supply power to the electronic device 20. According to an embodiment, one face of the battery pack 27 is adjacent to the display module 23 and the other face thereof is adjacent to the rear window 25, which may cause deformation and breakage of a counterpart object when the battery pack 27 is swollen at the time of charging. In order to prevent this, a swelling gap may be provided between the battery pack 27 and the counterpart object. According to an embodiment, the battery pack 27 may be disposed integrally with respect to the electronic device 20. However, the present disclosure is not limited thereto, and thus when the rear window 25 is implemented in a detachable manner in the electronic device 20, the battery pack 27 may be implemented in a detachable manner.

The housing 21 according to various embodiments may construct an outer portion (e.g., a side face including a metal bezel) of the electronic device 20, and may be combined with the inner support structure 22 to provide an inner space. According to an embodiment, the front window 24 may be disposed to the front face of the housing 21, and the rear window 25 may be disposed to the rear face thereof. However, the present disclosure is not limited thereto, and thus the rear face may be implemented in various ways such as injection using synthetic resin, metal, composite of metal and synthetic resin, or the like. According to an embodiment, a gap between the housing 21 and an internal structure constructed by the rear window 25 may prevent breakage of the rear window 25 against a secondary blow caused by the internal structure when an external impact such as a drop of the electronic device occurs.

The wireless power transmitting/receiving member 28 according to various embodiments may be disposed to the rear face of the housing 21. According to an embodiment, the wireless power transmitting/receiving member 28 constructed of a thin film in general is disposed in such a manner that it is attached to one side of an internal mounting component or, alternatively, a region of an internal side face of the housing 21, in particular, a region mostly adjacent to the rear window 25 in general, and includes a structure which constructs a contact point with the internal PCB 26. According to an embodiment, the wireless power transmitting/receiving member 28 may be embedded or, alternatively, attached as a component such as the battery pack 27 or the like or, alternatively, as a portion of the housing 21, and may be provided in such a manner that it is attached simultaneously to the component and the housing 21.

The second adhesive member 292 according to various embodiments may be applied in a similar manner to the aforementioned first adhesive member 291 as a component for fixing the rear window 25 to the housing 21.

According to various embodiments, the rear window 25 may be applied in a similar manner to the aforementioned front window 24. According to an embodiment, the front face (a face exposed to the outside) of the rear window 25 may have a curvature inclined toward both left and right ends. The rear face of the rear window 25 according to an embodiment may be constructed as a plane and may be bonded to the housing 21 by means of the second adhesive member 292.

Figure 3:
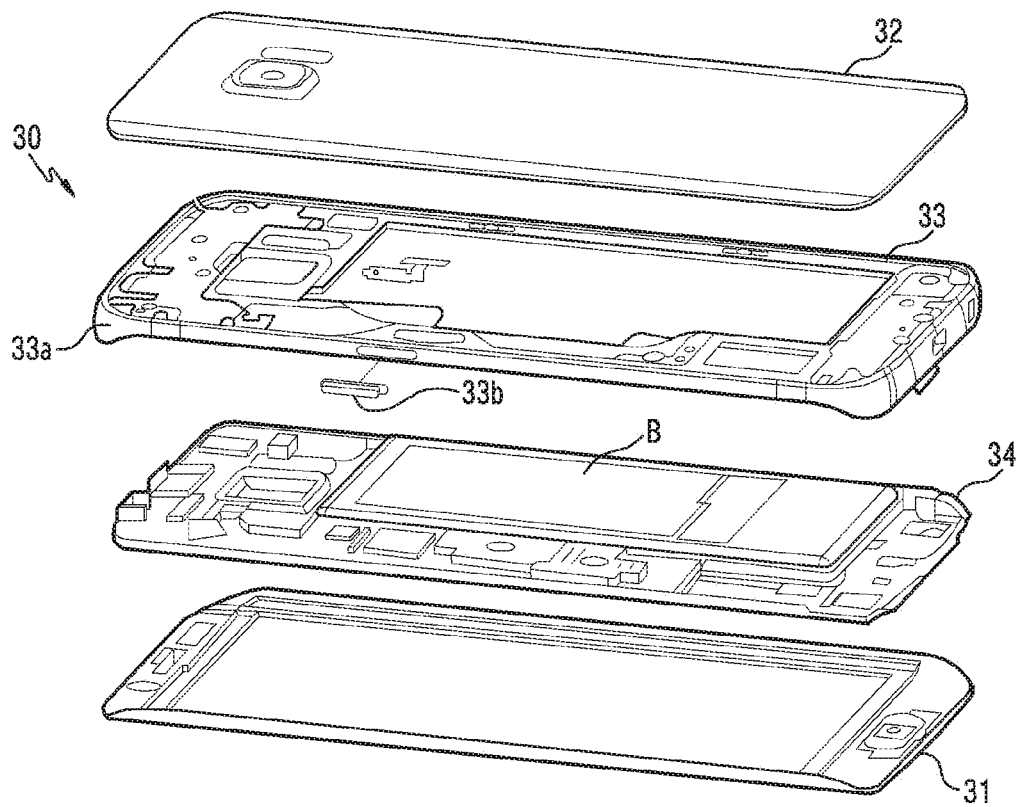
FIG. 3 is an exploded perspective view illustrating an electronic device according to various embodiments.

FIG. 3 is an exploded perspective view illustrating a main configuration of an electronic device according to various embodiments.

Referring to FIG. 3, an electronic device 30 according to various embodiments may be the same electronic device as the electronic device 20 of FIG. 2 or may be at least part of the electronic device.

The electronic device 30 according to various embodiments may have at least one member related to an exterior and disposed to an outer surface. For example, an exterior member such as a case 33 or the like including a front cover 31, a rear cover 32, and a sidewall 331 located at side faces may be disposed to most of the exterior of the electronic device 30. As another example, the exterior of the electronic device 30 may have a home key, a receiver, or the like disposed to a front face, may have a member such as a rear camera or flash, or, alternatively, a speaker disposed to a rear face, and may have a plurality of physical keys, a connector, or, alternatively, a microphone hole, or the like disposed to the sidewall 331.

The electronic device 30 according to various embodiments may require a configuration for preventing an external environment, for example, a foreign material such as water, from penetrating into members disposed to the exterior. The electronic device 30 according to various embodiments may include the front cover 31, the rear cover 32, the case 33, a structure 34, and a waterproof structure.

The front cover 31 according to various embodiments may construct the front face of the electronic device 30, and may serve as a front exterior. The front cover of the electronic device 30 according to various embodiments may be constructed of a transparent member. For example, the transparent member may include transparent synthetic resin or glass. A display supported by the structure may include a screen region exposed through the front cover.

The rear cover 32 according to various embodiments may constitute a rear face of the electronic device 30, and may serve as a rear exterior. The rear cover 32 of the electronic device 30 according to various embodiments may be constructed of a transparent or, alternatively, opaque member. For example, the transparent member may include transparent synthetic resin or glass, and the opaque member may be constructed of a material such as translucent/opaque synthetic resin or metal.

The sidewall 331 of the case 33 according to various embodiments may constitute a side face of a boundary of the electronic device 30, and may serve as a side exterior. The sidewall 331 of the electronic device according to various embodiments may be constructed of a conductive material, that is, a conductive sidewall. For example, the sidewall may be constructed of a metallic material, and may operate as an antenna radiator. The sidewall 331 according to various embodiments may at least partially surround a circumference of a space provided by the front cover 31 and the rear cover 32. The sidewall 331 according to various embodiments may be constructed integrally with respect to a conductive structure or a non-conductive structure.

The inner support structures 34 according to various embodiments may be plural in number. A first structure may be constructed to support a display, a substrate, or the like, and a second structure may be constructed to support an exterior member. For example, a structure capable of supporting and protecting other components such as a battery B may be constructed. The inner support structure 34 according to various embodiments may be constructed of synthetic resin, metal, or, alternatively, a combination thereof, and may be constructed of a metal alloy which contains magnesium.

Figure 4:
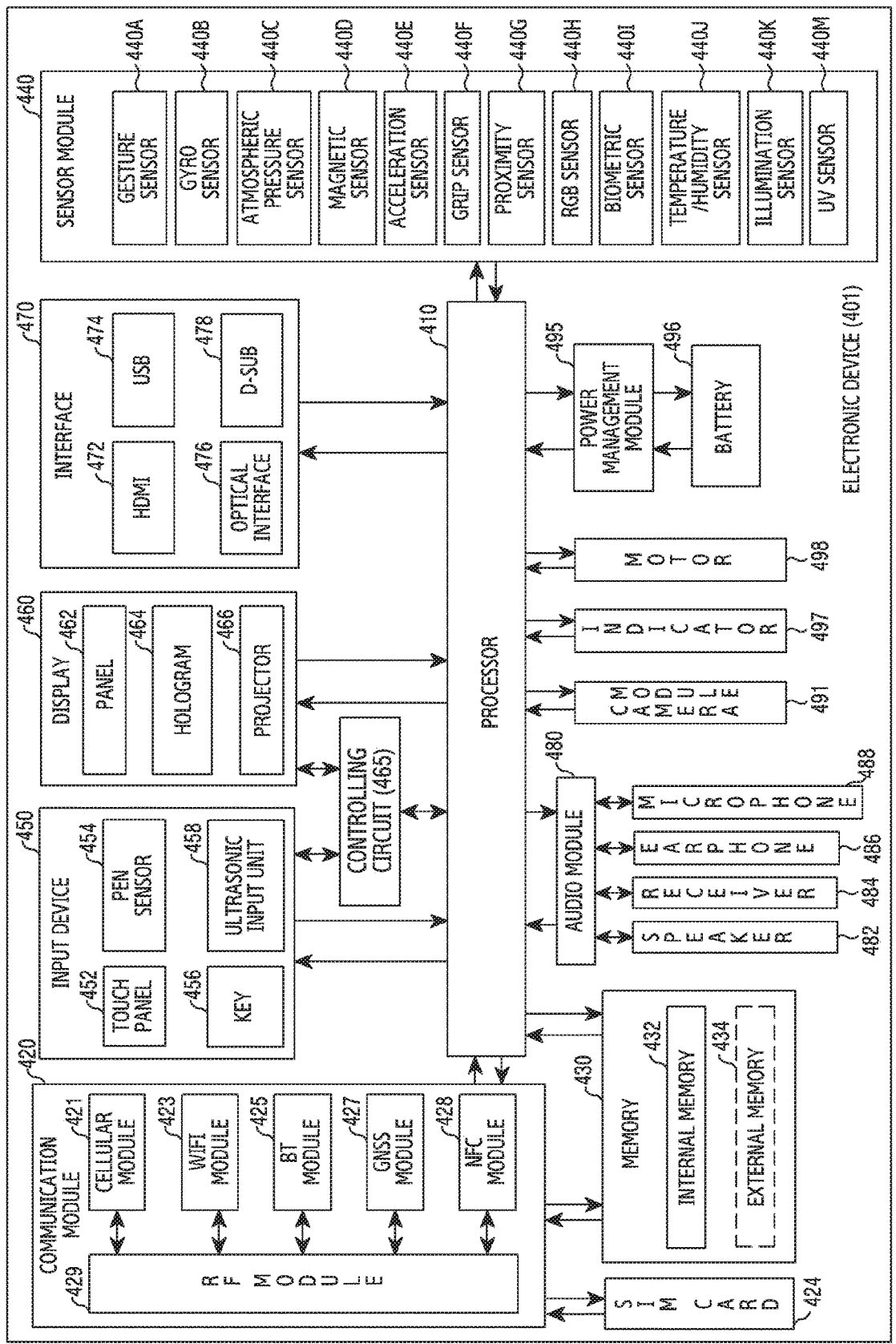
FIG. 4 is a block diagram illustrating a configuration of an electronic device according to various embodiments.

FIG. 4 is a block diagram of an electronic device 401 according to various embodiments.

Referring to FIG. 4, the electronic device 401 according to various embodiments may include, for example, all or part of the electronic device 10 of FIG. 1A and FIG. 1B.

The electronic device 401 according to various embodiments may include one or more processors (e.g., Application Processors (APs)) 410, a communication module 420, a subscriber identity module 424, a memory 430, a sensor module 440, an input unit 450, a display 460, an interface 470, an audio module 480, a camera unit 491, a power management module 495, a battery 496, an indicator 497, and a motor 498. The processor 410 may control a plurality of hardware or software components coupled with the processor 410 by driving, for example, an operating system or an application program, and may perform various data processing and computations. The processor 410 may be implemented, for example, with a System on Chip (SoC). According to an embodiment, the processor 410 may further include a Graphic Processing Unit (GPU) and/or an image signal processor. The processor 410 may include at least part (e.g., a cellular module 421) of the aforementioned components of FIG. 4. The processor 410 may process a command or data, which is received from at least one of different components (e.g., a non-volatile memory), by loading it to a volatile memory and may store a variety of data in the non-volatile memory.

The communication module 420 according to various embodiments may include, for example, the cellular module 421, a WiFi module 423, a BlueTooth (BT) module 425, a GNSS module 427, a Near Field Communication (NFC) module 428, and a Radio Frequency (RF) module 429. The cellular module 421 may provide a voice call, a video call, a text service, an Internet service, or the like, for example, through a communication network. According to an embodiment, the cellular module 421 may identify and authenticate the electronic device 401 in the communication network by using a subscriber identity module (e.g., a SIM card 424). According to an embodiment, the cellular module 421 may perform at least some functions that can be provided by the AP 410. According to an embodiment, the cellular module 421 may include a Communication Processor (CP). According to some embodiments, at least some (e.g., two or more) of the cellular module 421, the WiFi module 423, the BT module 425, the GPS module 427, and the NFC module 428 may be included in one Integrated Chip (IC) or IC package. The RF module 429 may transmit/receive, for example, a communication signal (e.g., a Radio Frequency (RF) signal). The RF module 429 may include, for example, a transceiver, a Power Amp Module (PAM), a frequency filter, a Low Noise Amplifier (LNA), an antenna, or the like. According to another embodiment, at least one of the cellular module 421, the WiFi module 423, the BT module 425, the GPS module 427, and the NFC module 428 may transmit/receive an RF signal via a separate RF module. The SIM card 424 may include, for example, a card including a SIM and/or an embedded SIM, and may include unique identification information (e.g., an Integrated Circuit Card IDentifier (ICCID)) or subscriber information (e.g., an International Mobile Subscriber Identity (IMSI)).

The memory 430 according to various embodiments may include, for example, an internal memory 432 or an external memory 434. The internal memory 432 may include, for example, at least one of a volatile memory (e.g., a Dynamic RAM (DRAM), a Static RAM (SRAM), a Synchronous Dynamic RAM (SDRAM), etc.) and a non-volatile memory (e.g., a One Time Programmable ROM (OTPROM), a Programmable ROM (PROM), an Erasable and Programmable ROM (EPROM), an Electrically Erasable and Programmable ROM (EEPROM), a mask ROM, a flash ROM, a flash memory, a hard drive, or a Solid State Drive (SSD)). The external memory 434 may further include a flash drive, for example, Compact Flash (CF), Secure Digital (SD), Micro Secure Digital (Micro-SD), Mini Secure digital (Mini-SD), extreme Digital (xD), memory stick, or the like.

The external memory 434 may be operatively and/or physically coupled with the electronic device 401 via various interfaces.

The sensor module 440 according to various embodiments may measure, for example, physical quantity or detect an operational status of the electronic device 401, and may convert the measured or detected information into an electric signal. The sensor module 440 may include, for example, at least one of a gesture sensor 440A, a gyro sensor 440B, a pressure sensor 440C, a magnetic sensor 440D, an acceleration sensor 440E, a grip sensor 440F, a proximity sensor 440G, a color sensor 440H (e.g., a Red, Green, Blue (RGB) sensor), a bio sensor 440I, a temperature/humidity sensor 440J, an illumination sensor 440K, and an Ultra Violet (UV) sensor 440M. Additionally or alternatively, the sensor module 440 may include, for example, an E-nose sensor, an ElectroMyoGraphy (EMG) sensor, an ElectroEncephaloGram (EEG) sensor, an ElectroCardioGram (ECG) sensor, an Infrared (IR) sensor, an iris sensor, and/or a fingerprint sensor. The sensor module 440 may further include a control circuit for controlling at least one or more sensors included therein. In some embodiments, the electronic device 401 may further include a processor configured to control the sensor module 404 either separately or as a part of the AP 410, and may control the sensor module 440 while the AP 410 is in a sleep state.

The input device 450 according to various embodiments may include, for example, a touch sensor module panel 452, a pressure sensor (or a "force sensor" interchangeably used hereinafter) module 453, a (digital) pen sensor 454, a key 456, or an ultrasonic input unit 458. The touch sensor module 452 may detect a 2-dimensional coordinate. The touch sensor module 452 may detect a touch position (X, Y). The touch sensor module panel 452 may recognize a touch input, for example, by using at least one of an electrostatic type, a pressure-sensitive type, and an ultrasonic type. The touch sensor module panel 452 may further include a control circuit. The touch panel 452 may further include a tactile layer and thus may provide the user with a tactile reaction. The pressure sensor module 453 may detect strength of pressure for a user's touch. The pressure sensor module 453 may detect a pressure value Z at the touch position (X, Y). The pressure sensor module 453 may further include a control circuit. In various embodiments, at least any one of configurations of the touch sensor module 452 and the pressure sensor module 453 may be shared with each other. The (digital) pen sensor 454 may be, for example, part of the touch panel, or may include an additional sheet for recognition. The key 456 may be, for example, a physical button, an optical key, a keypad, or a touch key. The ultrasonic input unit 458 may use a microphone (e.g., the microphone 488) to sense an ultrasonic wave generated in an input means, and may identify data corresponding to the sensed ultrasonic wave.

The display 460 according to various embodiments may include a panel 462, a hologram 464, a projector 466, and/or a control circuit for controlling these elements. The panel 462 may be implemented, for example, in a flexible, transparent, or wearable manner. The panel 462 may be constructed as one module with the touch panel 452. The hologram 464 may use an interference of light and show a stereoscopic image in the air. The projector 466 may display an image by projecting a light beam onto a screen. The screen may be located, for example, inside or outside the electronic device 401. The interface 470 may include, for example, a High-Definition Multimedia Interface (HDMI) 472, a Universal Serial Bus (USB) 474, an optical communication interface 476, or a D-subminiature (D-sub) 478. Additionally or alternatively, the interface 470 may include, for example, a Mobile High-definition Link (MHL) interface, a Secure Digital (SD)/Multi-Media Card (MMC) interface, or an Infrared Data Association (IrDA) standard interface.

The control circuit 465 according to various embodiments may be electrically coupled to the input device 450 and/or the display 460. The control circuit 465 may drive the input device 450 and/or the display 460. For example, the control circuit 465 may apply a driving signal to the input device 450 and/or the display 460, or may receive the driving signal from the input device 450 and/or the display 460. For example, the control circuit 465 may apply the driving signal to at least any one of the touch sensor module 452, the pressure sensor module 453, and the display 460, or may receive the driving signal therefrom. Alternatively, the control circuit 465 may apply the driving signal to at least two or all of the touch sensor module 452, the pressure sensor module 453, and the display 460, or may receive the driving signal therefrom. For example, the control circuit 465 may apply the driving signal sequentially to the touch sensor module 452, the pressure sensor module 453, and the display 460.

Specifically, the control circuit 465 may apply a transmission signal to one electrode of the touch sensor module 452 and/or the pressure sensor module 453. Alternatively, the control circuit 465 may receive a reception signal from one electrode of the touch sensor module 452 and/or the pressure sensor module 453. Alternatively, the control circuit 465 may couple an electrode of the touch sensor module 452 and/or the pressure sensor module 453 to a ground. Alternatively, the control circuit 465 may control a gate of a sub-pixel (RGB) in the display 460, or may apply a video signal to the sub-pixel (RGB).

The audio module 480 according to various embodiments may bilaterally convert, for example, a sound and electric signal. The audio module 480 may convert sound information which is input or output, for example, through a speaker 482, a receiver 484, an earphone 486, the microphone 488, or the like. The camera module 491 is, for example, a device for image and video capturing, and according to an embodiment, may include one or more image sensors (e.g., a front sensor or a rear sensor), a lens, an Image Signal Processor (ISP), or a flash (e.g., LED or xenon lamp). The power management module 495 may manage, for example, power of the electronic device 401. According to an embodiment, the power management module 495 may include a Power Management Integrated Circuit (PMIC), a charger Integrated Circuit (IC), or a battery fuel gauge. The PMIC may have a wired and/or wireless charging type. The wireless charging type may include, for example, a magnetic resonance type, a magnetic induction type, an electromagnetic type, or the like, and may further include an additional circuit for wireless charging, for example, a coil loop, a resonant circuit, a rectifier, or the like. The battery gauge may measure, for example, residual quantity of the battery 496 and voltage, current, and temperature during charging. The battery 496 may include, for example, a rechargeable battery and/or a solar battery.

The indicator 497 according to various embodiments may indicate a specific state, for example, a booting state, a message state, a charging state, or the like, of the electronic device 401 or a part thereof. The motor 498 may convert an electric signal into a mechanical vibration, and may generate a vibration or haptic effect. For example, the motor 498 may be a haptic actuator. The electronic device 401 may include a mobile TV supporting device (e.g., GPU) capable of processing media data according to a protocol of, for example, Digital Multimedia Broadcasting (DMB), Digital Video Broadcasting (DVB), mediaFlo™, or the like. Each of the components described in the present document may consist of one or more components, and names thereof may vary depending on a type of electronic device. In various embodiments, some of components of the electronic device (e.g., the electronic device 401) may be omitted, or additional components may be further included. Alternatively, some of the components may be combined and constructed as one entity, so as to equally perform functions of corresponding components before combination.

Hereinafter, a configuration of an electronic device will be described with reference to the accompanying drawings. For example, a display panel of the electronic device may employ any one of an Organic Light Emitting Diode (OLED) display panel and a Thin Film Transistor (TFT) Liquid Crystal Display (LCD) panel.

Figure 5:
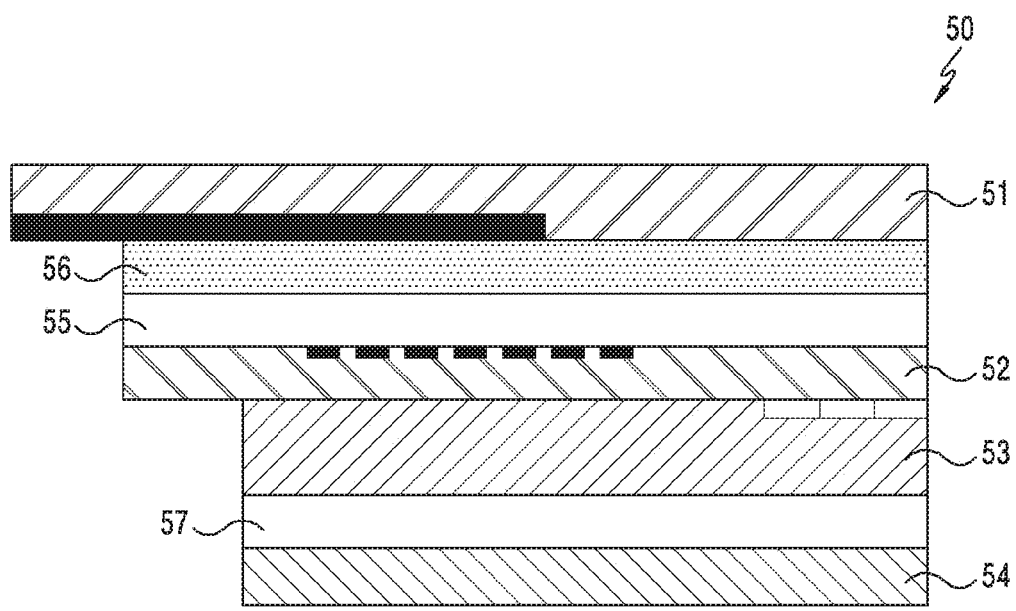
FIG. 5 is a cross-sectional view schematically illustrating a configuration of an electronic device with an Organic Light Emitting Diode (OLED) display according to various embodiments.

FIG. 5 is a cross-sectional view schematically illustrating a configuration of an electronic device with an OLED display according to various embodiments.

Referring to FIG. 5, an electronic device 50 according to various embodiments may include a structure in which a transparent substrate 51, a touch screen panel 52, an OLED display panel 53, and an input sensing panel 54 are laminated. For example, the input sensing panel 54 may employ any one of a pressure sensor, force sensor, and digitizer which can be used as an input device.

The electronic device 50 according to various embodiments may have the OLED-type display panel 53 disposed to occupy most of an area on a front face of the housing of the electronic device. The transparent substrate 51 and a polarizer 55 may be disposed on the touch screen panel 52 according to various embodiments. The polarizer 55 may be attached to a lower face of the transparent substrate 51 by means of a transparent adhesive 56 (Optically Clear Adhesive (OCA)). In addition, an embossed cushion layer 57 may be disposed between the OLED display panel 53 and the input sensing panel 54.

The OLED display panel 53 according to various embodiments may have an advantage in that a slim electronic device can be implemented and a curved display is possible, compared with the TFT LCD panel described below.

Figure 6:
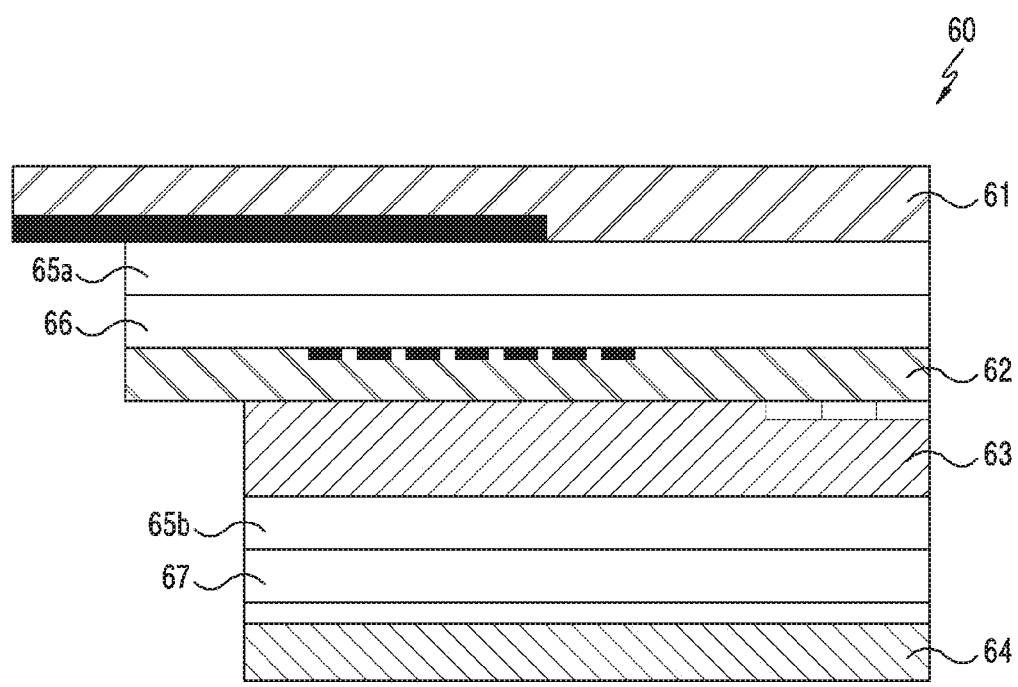
FIG. 6 is a cross-sectional view schematically illustrating a configuration of an electronic device with a Thin Film Transistor (TFT) Liquid Crystal Display (LCD) display according to various embodiments.

FIG. 6 is a cross-sectional view schematically illustrating a configuration of an electronic device with a TFT LCD display according to various embodiments.

Referring to FIG. 6, an electronic device 60 according to various embodiments may include a structure in which a transparent substrate 61, a touch screen panel 62, a TFT LCD display 63, and an input sensing panel 64 are laminated. For example, the input sensing panel 64 may employ any one of a pressure sensor, force sensor, and digitizer which can be used as an input device.

The electronic device 60 according to various embodiments may have the TFT LCD-type display panel 63 disposed to occupy most of an area on a front face of the housing of the electronic device. The electronic device 60 according to various embodiments may include the TFT LCD display panel 63, the touch screen panel 62 disposed on the TFT LCD display, and the input sensing panel 64, e.g., a digitizer panel, disposed below the TFT LCD display panel. The transparent substrate 61, an upper polarizer 65a, and a color filter 66 may be disposed on the touch screen panel 62. In addition, a lower polarizer 65b and a prism sheet 67 may be disposed between the display panel 63 and the input sensing panel 64.

Figure 7:
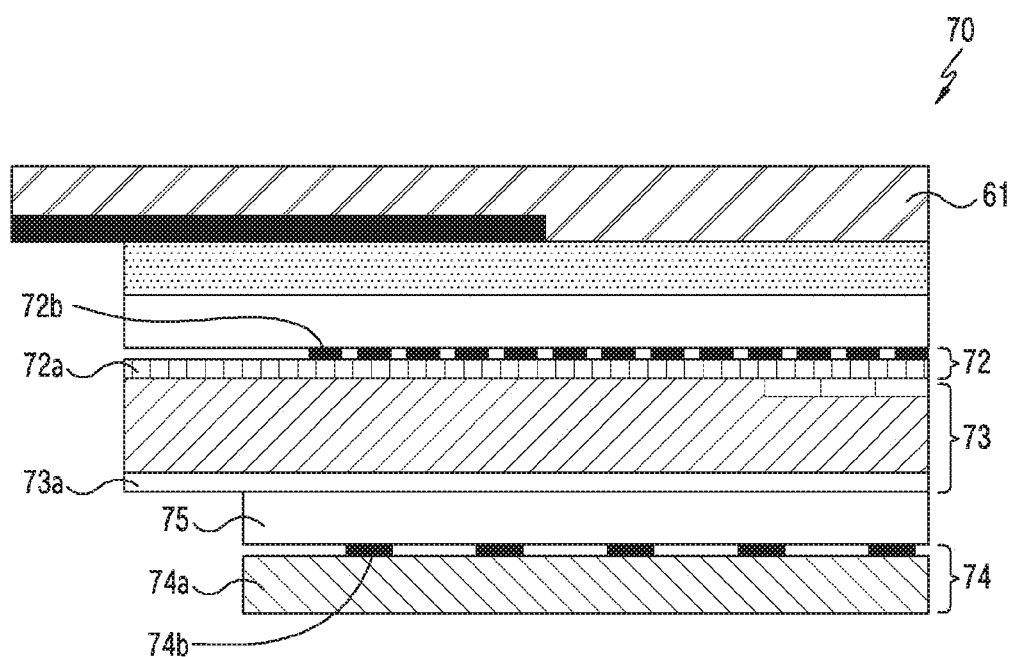
FIG. 7 is an enlarged view illustrating an important portion of FIG. 6.

FIG. 7 is an enlarged view illustrating an important portion of FIG. 6.

Referring to FIG. 7, an electronic device 70 according to various embodiments has a touch screen panel 72 disposed to an upper face of an OLED display panel 73 and an input sensing panel 74 disposed to a lower face thereof. The touch screen panel 72 may have a structure in which a plurality of conductive patterns 72b can be disposed in a Thin Film Encapsulation (TFE) layer 72a, and a capacitance change amount depending on a touch operation can be detected. A PI+PET substrate may be disposed to a lower face 73a of the OLED display panel 73. The input sensing panel 74 may have conductive patterns 74b constructed on a flexible circuit board 74a. A cushion layer 75 may be disposed between the OLED display panel 73 and the input sensing panel 74.

Figure 8A:
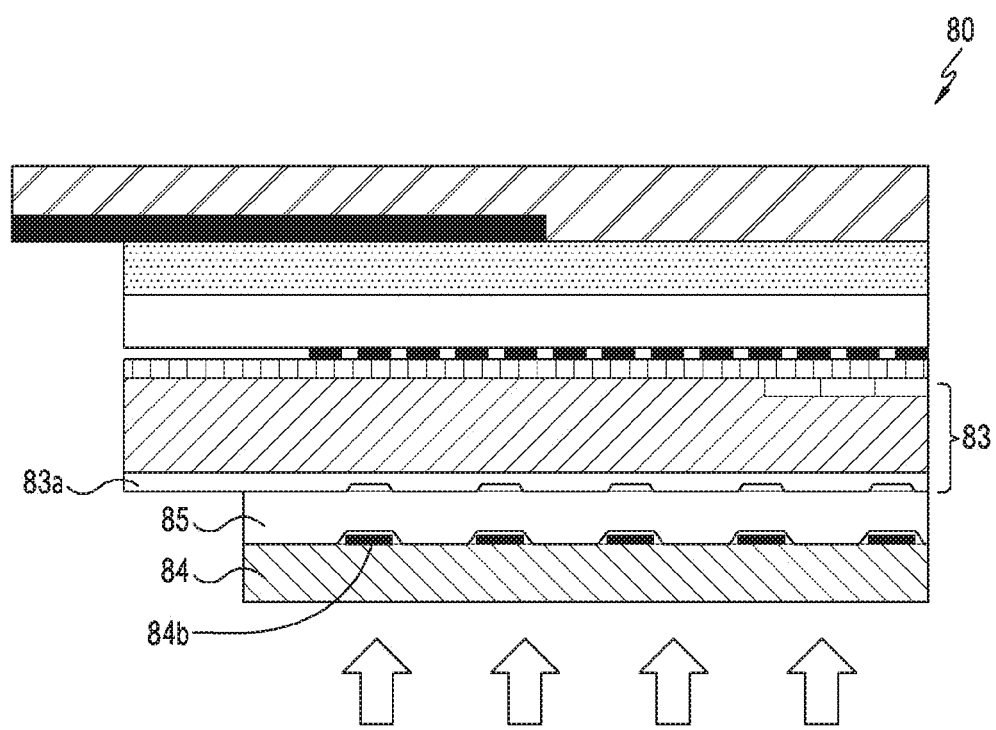
FIG. 8A is a cross-sectional view schematically illustrating a configuration of a display assembly manufactured by a pressing process according to various embodiments.
Figure 8B:
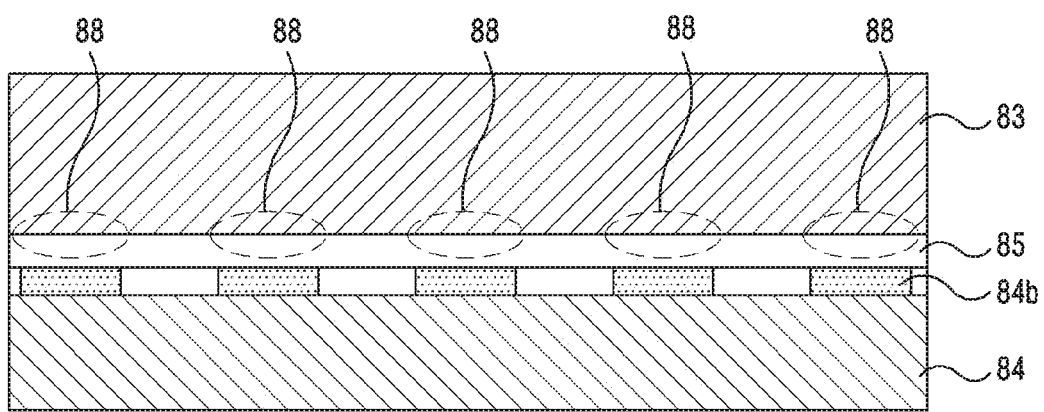
FIG. 8B is a cross-sectional view illustrating a portion in which a cushion layer adhered to each conductive pattern is pressed in a pressing process according to various embodiments.

FIG. 8A is a cross-sectional view schematically illustrating a configuration of a display assembly manufactured by a pressing process according to various embodiments. FIG. 8B is a cross-sectional view illustrating a portion in which a cushion layer adhered to each conductive pattern is pressed in a pressing process according to various embodiments.

Referring to FIG. 8A and FIG. 8B, when a display panel 83 and an input sensing panel 84 are pressed at a high pressure during a process of assembling an electronic device 80, a lower face of the display panel 83 and an upper face of the input sensing panel 84 may be strongly adhered to each other.

A PI+PET substrate constructing a lower face 83a of the display panel 83 and an embossed cushion layer 85 are significantly low in an elastic modulus indicating a hardness/softness of a material. Therefore, conductive patterns 84b constructed on the input sensing panel 84 may cause a pressing phenomenon (indicated by a reference numeral 88) due to the pressing process.

The conductive pattern 84b of the input sensing panel 84, for example, the digitizer panel, is an EMR pattern, and there is a specific space between the patterns. Due to each pattern 84b and the space between the patterns 84b, a pattern of a concavo-convex shape may appear in the PI-PET substrate and the cushion layer.

Due to the concavo-convex shape, when the display panel 83 having a high transmittance is seen under bright illumination, a pattern of at least one or more concavo-convex shapes (a contrast pattern) may appear on a surface of the display panel 83.

The aforementioned problem may also equally occur when the TFT LCD display panel of FIG. 6 is applied instead of the OLED display panel.

Hereinafter, a configuration of an electronic device with an input sensing panel according to various embodiments of the present disclosure will be described in detail with reference to the accompanying drawings, compared with the conventional embodiment.

Figure 9:
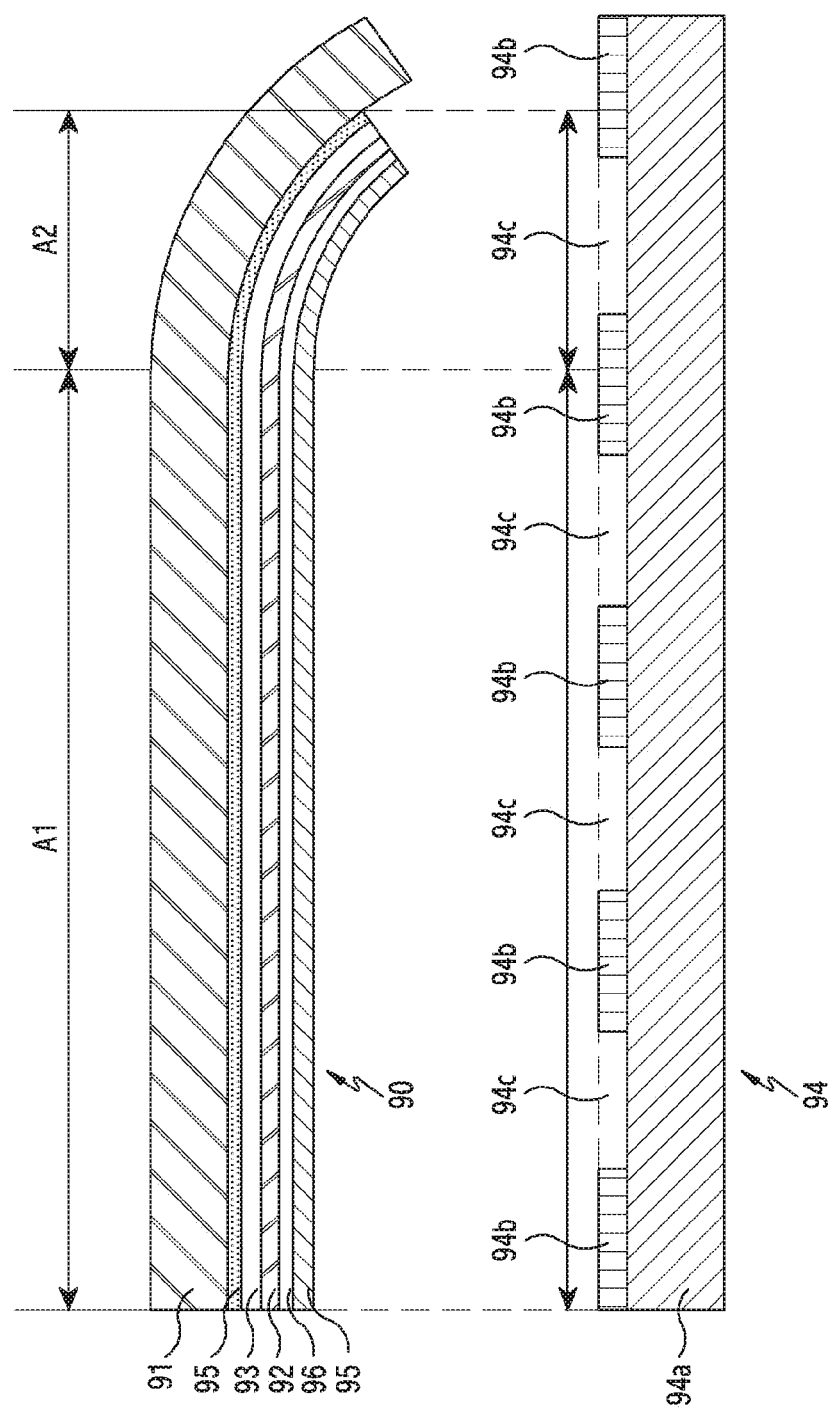
FIG. 9 is a cross-sectional view illustrating a configuration of a digitizer in a flat display section and curved display section of a display panel provided in an electronic device according to various embodiments.

FIG. 9 is a cross-sectional view illustrating a configuration of a digitizer in a flat display section and curved display section of a display panel provided in an electronic device according to various embodiments.

Referring to FIG. 9, an electronic device according to various embodiments may include a transparent substrate 91, a touch screen display panel 92, and an input sensing panel 94. These components may be disposed to be laminated in a vertical direction. An assembly in which these components are disposed to be laminated in the vertical direction may be referred to as a display assembly 90. A reference numeral 94 may indicate a polarizer, and a reference numeral 95 may indicate a transparent adhesive for bonding the polarizer to the transparent substrate.

The display assembly 90 according to various embodiments may be divided into an activating area in which data is displayed and an inactivating area in which no data is displayed. In addition, the display assembly 90 may be constructed of a flat display area A1 and a curved display area A2. For example, the curved display area A2 may be disposed to an edge area of the flat display area A1.

The input sensing panel 94 according to the conventional embodiment, that is, a digitizer panel, may include a digitizer flexible circuit board 94a (hereinafter, referred to as a substrate) and a plurality of conductive patterns 94b constructed on a first face of the digitizer flexible circuit board 94a. Each of the conductive patterns 94b may be disposed with an equal interval, as a signal line. A space 94c may exist between the conductive patterns 94b. Each space 94c may be provided in a recess shape on the first face of the flexible circuit board 94a.

However, as described in FIG. 8, due to a concavo-convex shape (a contrast or a pattern) constructed of the conductive patterns 94b and the space 94c, when display 90 having a high transmittance is seen under bright illumination, a pattern of at least one or more concavo-convex shapes (a contrast pattern) may appear on a surface of the display panel.

A configuration of an electronic device with a display assembly 100 of the present disclosure will be described, compared with the electronic device with the conventional display assembly 90.

Figure 10:
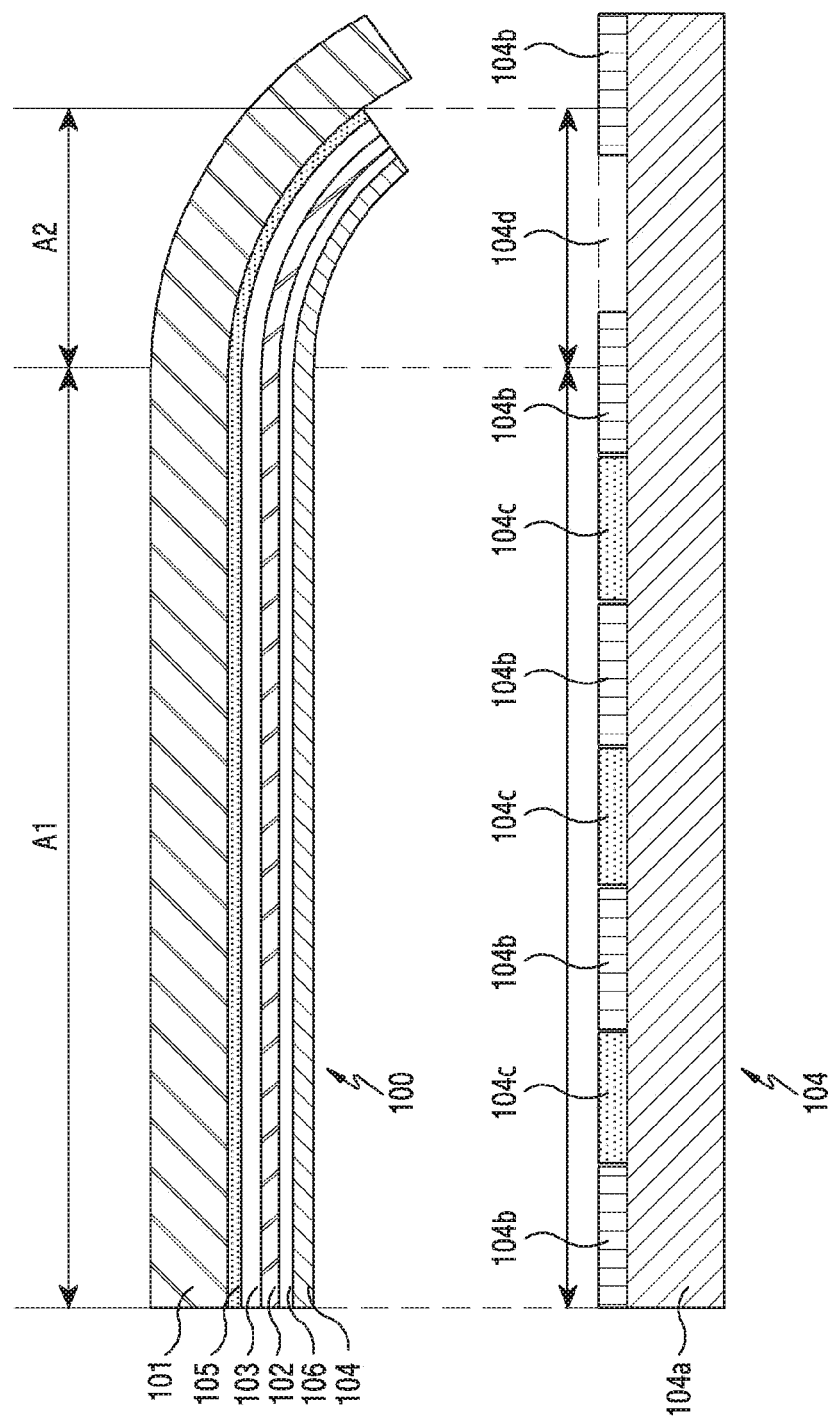
FIG. 10 is a cross-sectional view illustrating a configuration of a digitizer in a flat display section and curved display section of a display panel provided in an electronic device according to various embodiments of the present disclosure.

FIG. 10 is a cross-sectional view illustrating a configuration of a digitizer in a flat display section and curved display section of a display panel provided in an electronic device according to various embodiments of the present disclosure.

Referring to FIG. 10, the electronic device according to various embodiments of the present disclosure may include a transparent substrate 101, a touch screen display panel 102, and an input sensing panel 104. These components may be disposed to be laminated in a vertical direction. The components disposed to be laminated may be called the display assembly 100.

For example, as a protective member served as a transparent cover or a transparent window, the transparent substrate 101 may be constructed of a material having an excellent property in terms of light transmission, heat resistance, chemical resistance, mechanical strength, or the like. The transparent substrate 101 may be a glass substrate or a transparent film constructed of, for example, polymer or the like.

For example, the transparent substrate 101 may include any one, or a combination of two, selected from Acrylonitrile Butadiene Styrene (ABS), acrylic, PolyCarbonate (PC), PolyMethyl MethAcrylate (PMMA), PolyImide (PE), Poly-Ethylene Terephthalate (PET), PolyPropylene Terephthalate (PPT), Amorphous PolyEthylene Terephthalate (APET), Polyethylene Naphthalate Terephthalate (PEN), PolyEthylene Terephthalate Glycol (PETG), Tri-Acetyl-Cellulose (TAC), Cyclic Olefin Polymer (COP), Cyclic Olefin Copolymer (COC), poly-DicyCloPentaDiene (DCPD), CycloPentDienyl anions (CPD), PolyARylate (PAR), PolyEtherSulfone (PES), Poly Ether Imide (PEI), a modified epoxy resin, and an acrylic resin. Alternatively, the transparent substrate 101 may be a variety of high hardness films. When the transparent substrate 101 is the high hardness film, coating of a surface treatment portion may be hard coating.

The display assembly 100 according to various embodiments may be divided into an activating area in which data is displayed and an inactivating area in which no data is displayed. In addition, the display assembly 100 may be constructed of a flat display area A1 and a curved display area A2. For example, the curved display area A2 may be disposed to an edge area of the flat display area A1.

The curved display area A2 according to various embodiments may be disposed to upper/lower edge areas or left/right edge areas among upper/lower/left/right edge areas of the flat display area A1 or any one of an upper portion, a lower portion, a left portion, and a right portion.

The input sensing panel 104 according to various embodiments of the present disclosure may include a digitizer flexible circuit board 104a (hereinafter, referred to as a substrate), at least one conductive pattern 104b constructed on a first face of the substrate 104a, and at least one dummy pattern 104c disposed between the conductive patterns 104b. Each of the conductive patterns 104b may be disposed with an equal interval, as a signal line. One or more dummy patterns 104c disposed between the conductive patterns 104b may be constructed with an equal interval, as a non-signal line.

Each of the dummy patterns 104c according to various embodiments may be constructed to have substantially the same thickness as that of each of the conductive patterns 104b. In other words, each of the dummy patterns 104c may be disposed to be co-planar with each of the conductive patterns 104b.

Since the conductive patterns 104b and the dummy patterns 104c are disposed to be co-planar with each other, a concavo-convex shape may not be provided on a plane where the conductive patterns 104b and the dummy patterns 104c are present after a process of pressing the display assembly 100. According to this structure, a pattern of the concavo-convex shape may hardly be seen when the activating area of the display assembly 100 which has been completely subjected to the pressing process is seen under illumination.

The dummy pattern may not be constructed on the input sensing panel 104 in the curved display area A2 of the display assembly 100 according to various embodiments, and a space 104d may be disposed thereto. When the display assembly 100 is viewed from above, each of the dummy patterns 104c may be constructed between the conductive patterns 104b of the input sensing panel 104 in the flat display area A1, whereas each of the dummy pattern may not be constructed between the conductive patterns 104b of the input sensing panel 104 in the curved display area A2.

The curved display area A2 according to various embodiments may be constructed through a bending process in the flat display area A1. Therefore, the input sensing panel 104 may also be bent according to the bending process, and a detachment phenomenon may occur in the dummy pattern according to the bending process.

Accordingly, the input sensing panel 104 in the curved display area A2 may have the space 104d in which no dummy pattern is constructed.

Hereinafter, a configuration of a reception digitizer panel and transmission digitizer panel constituting an input sensing panel, for example, a digitizer panel, will be described, compared with a configuration according to the conventional embodiment and a configuration according to various embodiments of the present disclosure. In an orthogonal coordinate system in use, an X-axis may indicate a horizontal axis, a Y-axis may indicate a vertical axis, and a Z-axis may indicate a thickness direction.

Figure 11A:
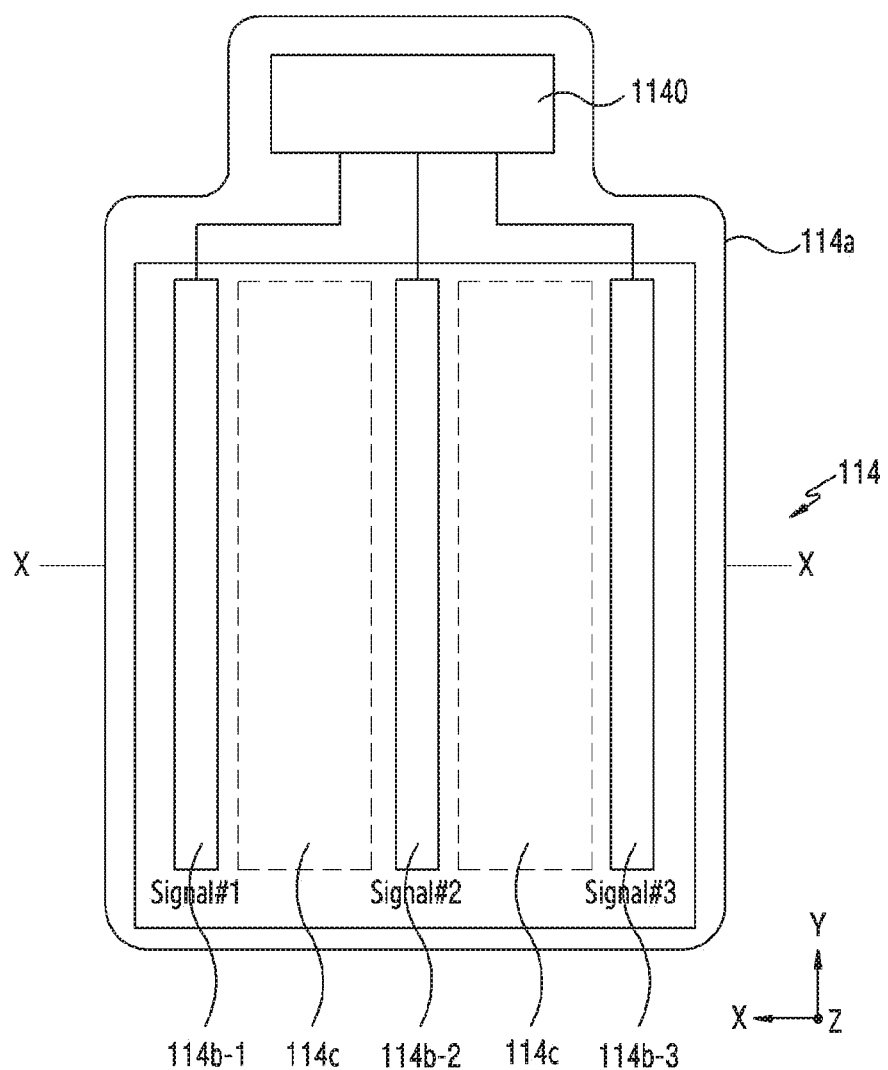
FIG. 11A is a plan view illustrating a reception digitizer panel according to the conventional various embodiments.
Figure 11B:
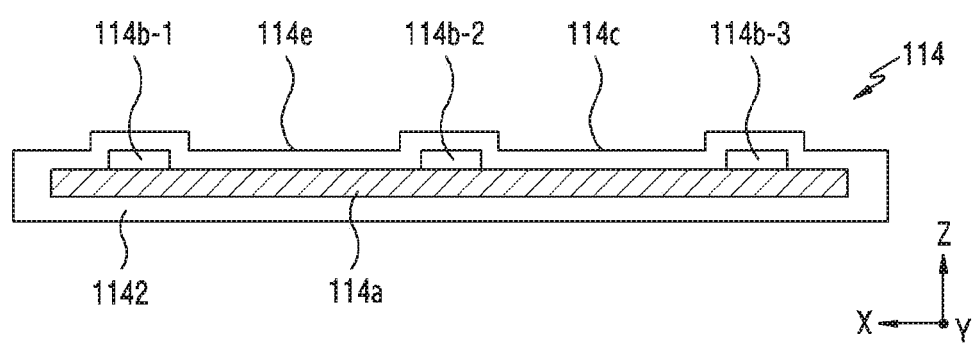
FIG. 11B is a cross-sectional view cut along the line X-X of FIG. 11A.

FIG. 11A is a plan view illustrating a reception digitizer panel according to the conventional various embodiments, and FIG. 11B is a cross-sectional view cut along the line X-X of FIG. 11A.

Referring to FIG. 11A and FIG. 11B, a reception digitizer panel 114 according to the various embodiments may include a flexible circuit board 114a and at least one or more conductive patterns 114b-1, 114b-2, and 114b-3 constructed on a first face of the flexible circuit board 114a. Each of the conductive patterns 114b-1, 114b-2, and 114b-3 may have a shape extended in a Y-axis direction, and may be constructed in a linear shape with an equal interval. Each of the conductive patterns 114b-1, 114b-2, and 114b-3 may be electrically coupled to a digitizer sensor 1140 by means of a signal line. A shape of each of the conductive patterns 114b-1, 114b-2, and 114b-3 constructed on the flexible circuit board 114a is not necessarily limited to a linear shape, and may be changed into various shapes such as a square, a rectangle, a lozenge, or the like. The digitizer sensor 1140 is not necessarily limited to be disposed to the flexible circuit board 114a, and thus may be disposed to a main printed circuit board (not shown). For example, the digitizer sensor 1140 may be electrically coupled to the flexible circuit board 114a, but may not be disposed at the same position.

The reception digitizer panel 114 according to various embodiments may have an empty space 114c between each of the conductive patterns 114b-1, 114b-2, and 114b-3. Each space 114c may be constructed on the flexible circuit board 114a with an equal interval. A reference numeral 1142 may indicate a protective layer.

Figure 12:
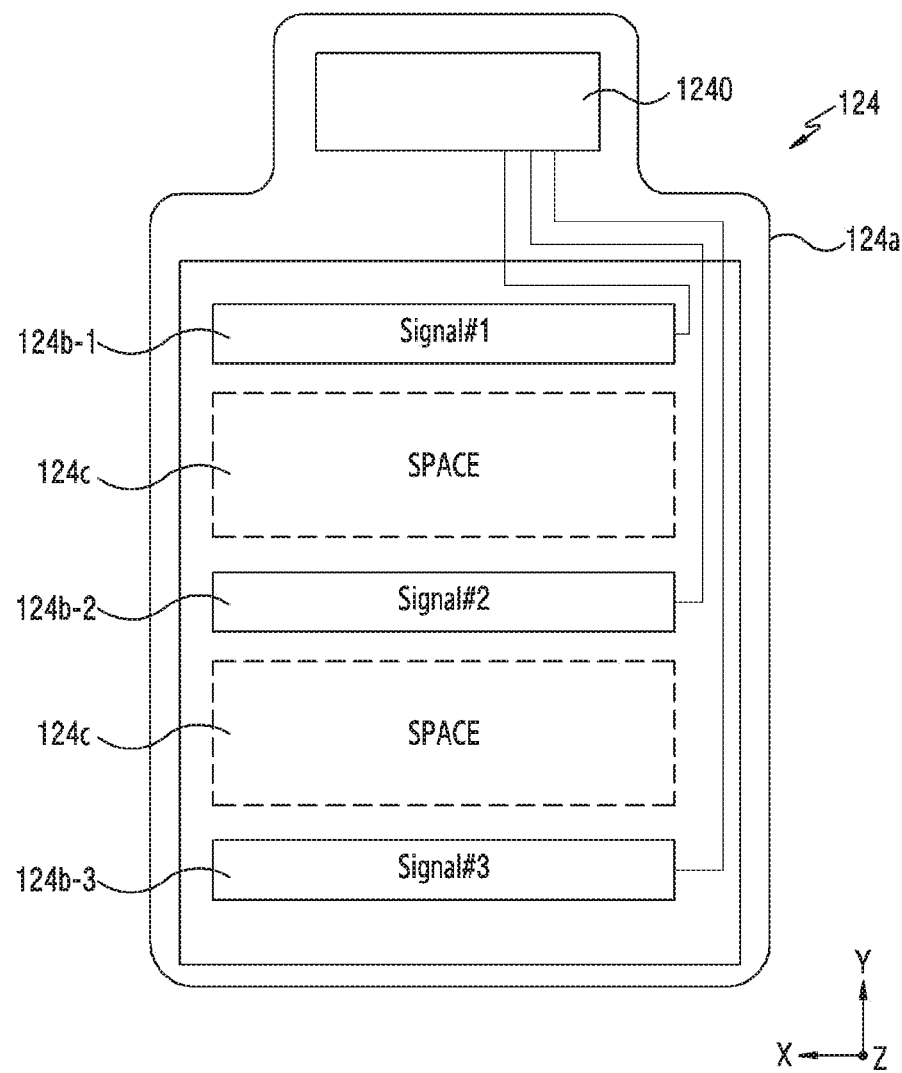
FIG. 12 is a plan view illustrating a transmission digitizer panel according to the conventional various embodiments.

FIG. 12 is a plan view illustrating a transmission digitizer panel according to the conventional various embodiments.

Referring to FIG. 12, a transmission digitizer panel 124 according to the conventional various embodiments may include a flexible circuit board 124a and at least one or more conductive patterns 124b-1, 124b-2, and 124b-3 constructed on a first face of the flexible circuit board 124a. Each of the conductive patterns 124b-1, 124b-2, and 124b-3 may have a shape extended in an X-axis direction, and may be constructed in a linear shape with an equal interval. Each of the conductive patterns 124b may be electrically coupled to a digitizer sensor 1240 by means of a signal line. A shape of the conductive patterns 124b-1, 124b-2, and 124b-3 constructed on the flexible circuit board 124a is not necessarily limited to a linear shape, and may be changed into various shapes such as a square, a rectangle, a lozenge, or the like. The digitizer sensor 1240 is not necessarily limited to be disposed to the flexible circuit board 124a, and thus may be disposed to a main printed circuit board (not shown). For example, the digitizer sensor 1240 may be electrically coupled to the flexible circuit board 124a, but may not be disposed at the same position.

The reception digitizer panel 124 according to various embodiments may have an empty space 124c between each of the conductive patterns 124b-1, 124b-2, and 124b-3. Each space 124c may be constructed on the flexible circuit board 124a with an equal interval.

Figure 13A:
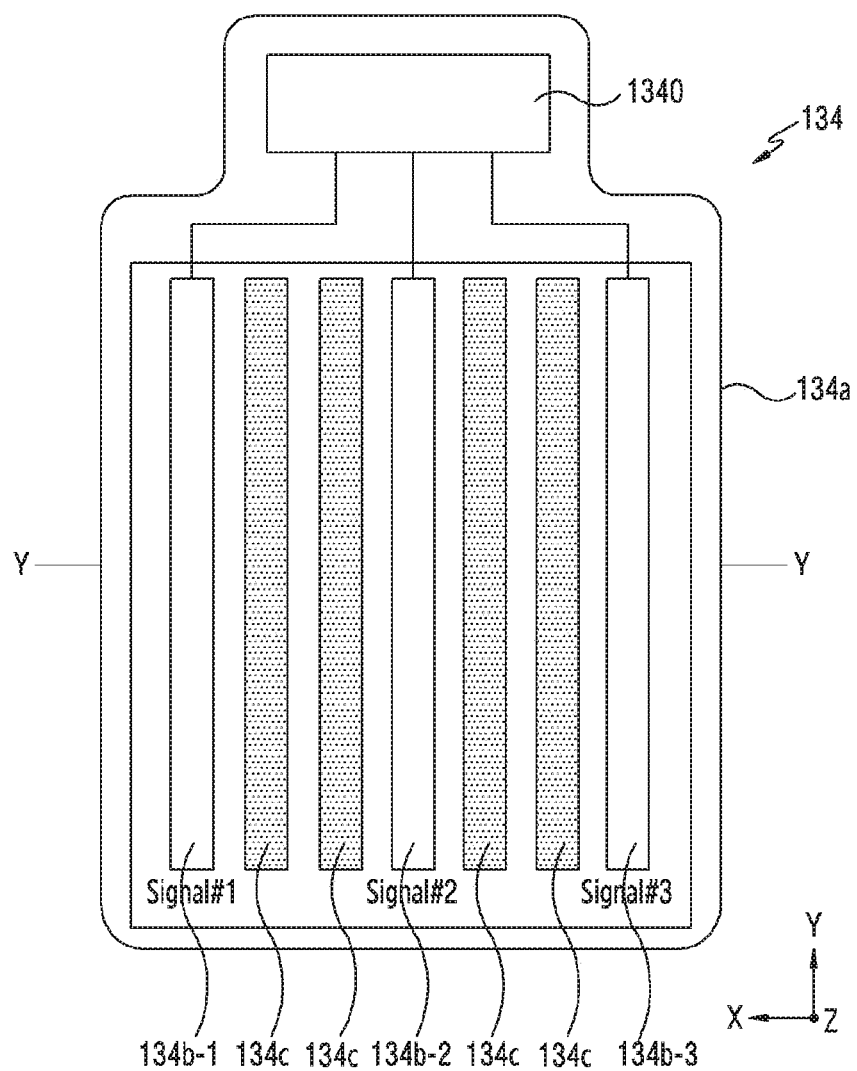
FIG. 13A is a plan view illustrating a reception digitizer panel according to various embodiments of the present disclosure.
Figure 13B:
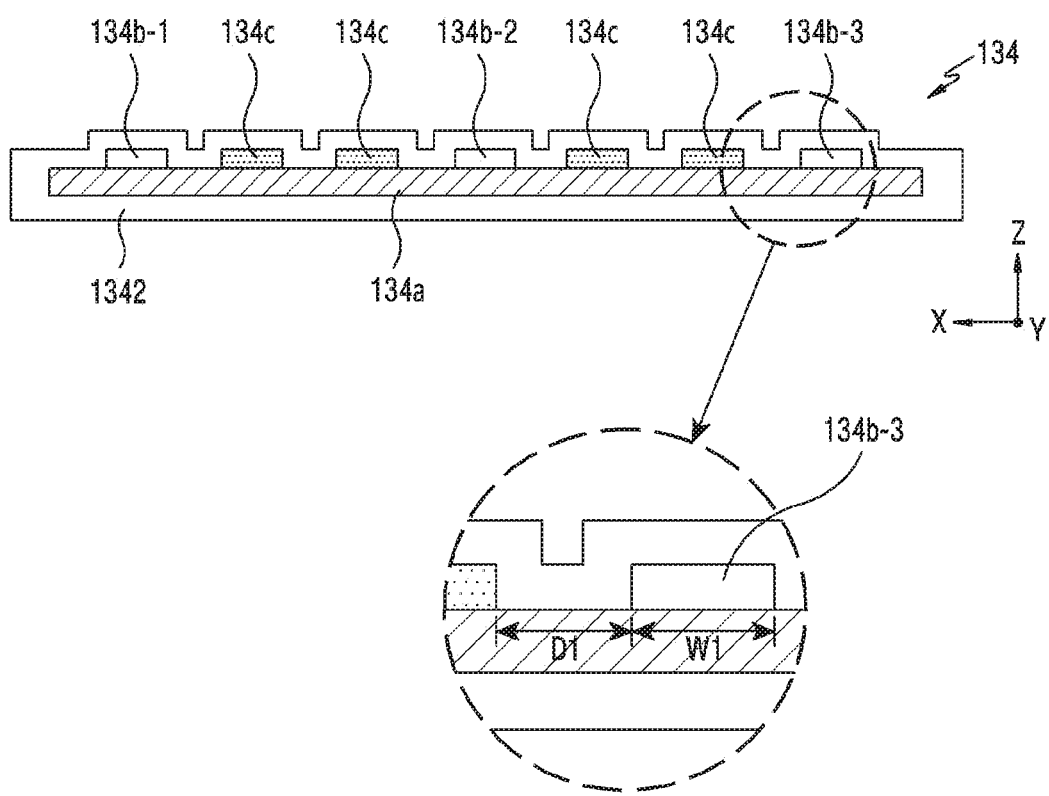
FIG. 13B is a cross-sectional view cut along the line Y-Y of FIG. 13A.

FIG. 13A is a plan view illustrating a reception digitizer panel according to various embodiments of the present disclosure, and FIG. 13B is a cross-sectional view cut along the line Y-Y of FIG. 13A.

Referring to FIG. 13A and FIG. 13B, a reception digitizer panel 134 according to various embodiments of the present disclosure may include a flexible circuit board 134a, at least one or more conductive patterns 134b-1, 134b-2, and 134b-3 constructed on a first face of the flexible circuit board 134a, and at least one or more dummy patterns 134c disposed between each of the conductive patterns 134b-1, 134b-2, and 134b-3. Each of the conductive patterns 134b-1, 134b-2, and 134b-3 has a strip shape, and thus may be referred to as a conductive strip. Each of the dummy patterns 134c has a strip shape, and thus may be referred to as a strip.

Each of the conductive patterns 134b-1, 134b-2, and 134b-3 may have a shape extended in a Y-axis direction, and may be constructed in a linear shape with an equal interval. Each of the dummy patterns 134c may be extended in a Y-axis direction between each of the conductive patterns 134b-1, 134b-2, and 134b-3, and may be constructed in a linear shape. At least one or more dummy patterns 134c may be constructed between each of the conductive patterns 134b-1, 134b-2, and 134b-3. Each of the dummy patterns 134c may be constructed of a non-conductive material or may be constructed of the same material as that of each of the conductive patterns 134b-1, 134b-2, and 134b-3, but may not be electrically coupled thereto.

The conductive patterns 134b-1, 134b-2, and 134b-3 may have a first thickness in a first direction, may be extended parallel to one another, and may be separated from one another in a third direction perpendicular to first and second directions of the housing. Each of the dummy patterns 134c may be disposed between adjacent two conductive patterns among the plurality of conductive patterns 134b-1, 134b-2, and 134b-3, may have the first thickness in the first direction, and may be disposed substantially to be co-planar with the two conductive strips.

The dummy pattern 134c according to various embodiments may further include adjacent another second dummy pattern separated from two conductive patterns in a third direction, between adjacent two conductive patterns among the plurality of conductive patterns 134b-1, 134b-2, and 134b-3. The second dummy pattern may include the same material as that of each of the plurality of conductive patterns. A conductive material of the conductive patterns 134b-1, 134b-2, and 134b-3 may include copper. The conductive material of the dummy pattern 134c may include copper.

Each of the conductive patterns 134b-1, 134b-2, and 134b-3 may be electrically coupled to a digitizer sensor 1340 by means of a signal line. A shape of the conductive patterns 134b-1, 134b-2, and 134b-3 constructed on the flexible circuit board 134a is not necessarily limited to a linear shape, and may be changed into various shapes such as a square, a rectangle, a lozenge, or the like. The digitizer sensor 1340 is not necessarily limited to be disposed to the flexible circuit board 134a, and thus may be disposed to a main printed circuit board (not shown). For example, the digitizer sensor 1340 may be electrically coupled to the flexible circuit board 134a, but may not be disposed at the same position.

Each of the conductive patterns 134b-1, 134b-2, and 134b-3 according to various embodiments may be constructed to have the same thickness as that of each of the dummy patterns 134c, and may be constructed to be substantially co-planar with one another. Each of the conductive patterns 134b-1, 134b-2, and 134b-3 may be disposed to be very close to the dummy pattern 134c or may be disposed to be separated therefrom. A reference numeral 1342 may be a protective layer.

Each of the conductive patterns 134b-1, 134b-2, and 134b-3 and dummy patterns 134c according to various embodiments may be constructed to have the same or different horizontal width. When the horizontal width of the conductive pattern is defined as W1 and a distance between the conductive pattern and the dummy pattern is defined as D1, a value D1/W1 may be in the range of 0.5 to 1.5.

Figure 14:
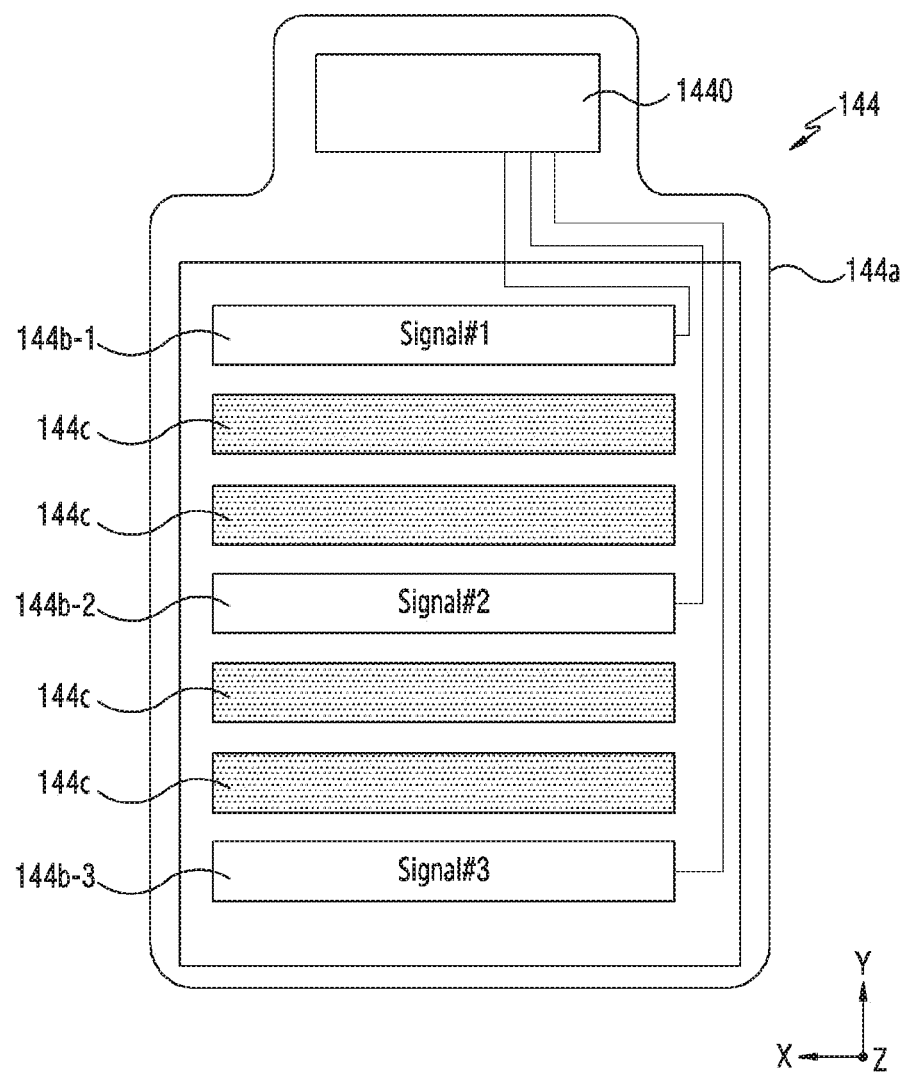
FIG. 14 is a plan view illustrating a transmission digitizer panel according to various embodiments.

FIG. 14 is a plan view illustrating a transmission digitizer panel according to various embodiments.

Referring to FIG. 14, a transmission digitizer panel 144 according to various embodiments of the present disclosure may include a flexible circuit board 144a and at least one or more conductive patterns 144b-1, 144b-2, and 144b-3 constructed on a first face of the flexible circuit board 144a, and a dummy pattern 144c disposed between each of the conductive patterns 144b-1, 144b-2, and 144b-3. Each of the conductive patterns 144b-1, 144b-2, and 414b-3 may be extended in an X-axis direction, and may be constructed in a linear shape with an equal interval. Each of the conductive patterns 144b-1, 144b-2, and 144b-3 may be electrically coupled to a digitizer sensor 1440 by means of a signal line. Each of the dummy pattern 144c may be extended in the X-axis direction between each of the conductive patterns 144b-1, 144b-2, and 144b-3, and may be constructed in a linear shape. At least one or more dummy patterns 144c may be constructed between each of the conductive patterns 144b-1, 144b-2, and 144b-3. Each of the dummy patterns 144c may be constructed of a non-conductive material, and may not be a signal line.

A shape of the conductive patterns 144b-1, 144b-2, and 144b-3 constructed on the flexible circuit board 144a is not necessarily limited to a linear shape, and may be changed into various shapes such as a square, a rectangle, a lozenge, or the like. The digitizer sensor 1440 is not necessarily limited to be disposed to the flexible circuit board 144a, and thus may be disposed to a main printed circuit board (not shown). For example, the digitizer sensor 1440 may be electrically coupled to the flexible circuit board 144a, but may not be disposed at the same position.

Figure 15:
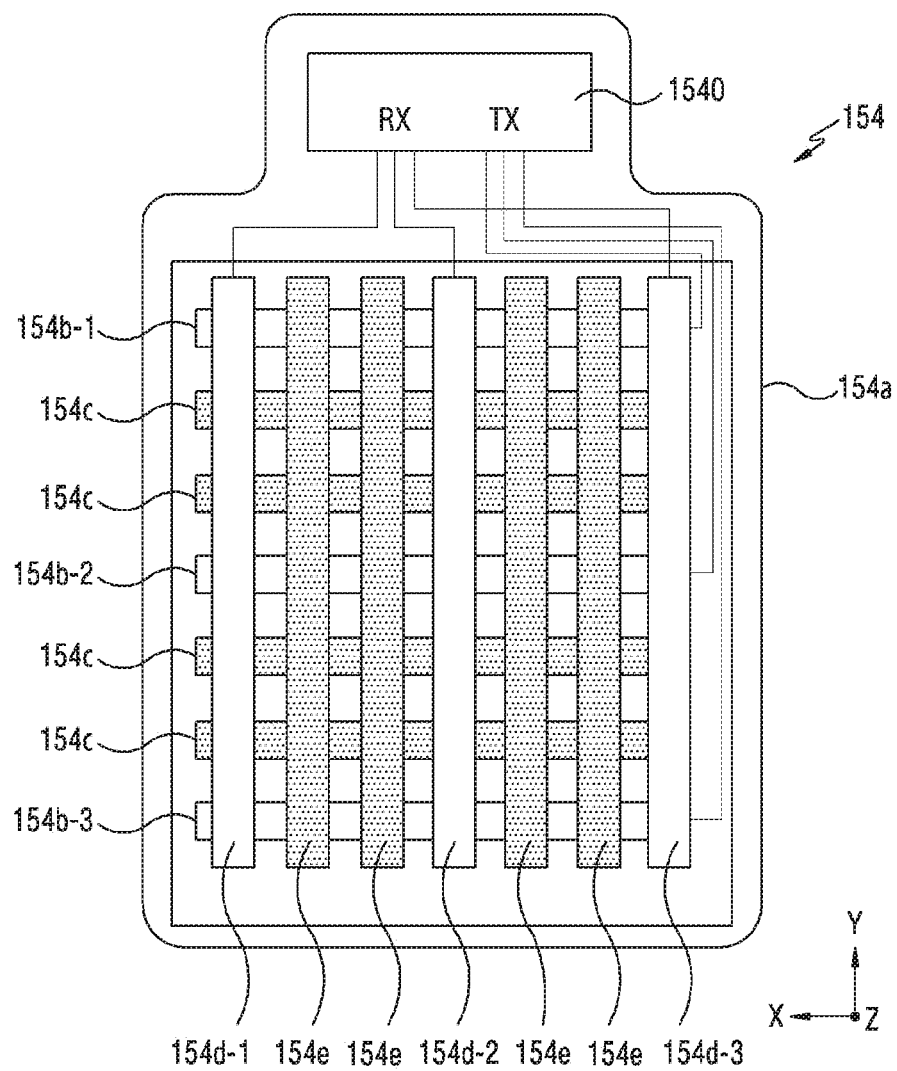
FIG. 15 illustrates a digitizer panel in which digitizer panels in a receiving side and a transmitting side are integrated according to various embodiments of the present disclosure.

FIG. 15 illustrates a digitizer panel 154 in which digitizer panels in a receiving side and a transmitting side are integrated according to various embodiments of the present disclosure.

The digitizer panel 154 according to various embodiments may include a flexible circuit board 154a, at least one or more transmission conductive patterns 154b-a, 154b-2, and 154b-3 constructed along an X-axis direction on a first face of the flexible circuit board 154a, at least one or more transmission dummy patterns 154c constructed between each of the transmission conductive patterns 154b-1, 154b-2, and 154b-3, at least one or more reception conductive patterns 154d-1, 154d-2, and 154d-3 constructed along a Y-axis direction, and at least one or more reception dummy patterns 154e disposed between each of the reception conductive patterns 154d-1, 154d-2, and 154d-3.

At least part of the reception conductive patterns 154d-1, 154d-2, and 154d-3 according to various embodiments may be disposed to overlap with at least part of the transmission conductive patterns 154b-1, 154b-2, and 154b-3, or may be disposed to overlap with at least part of the transmission dummy pattern 154c. In addition, at least the remaining parts of the reception conductive patterns 154d-1, 154d-2, and 154d-3 may be disposed to overlap with at least part of the flexible circuit board 154a.

At least part of the reception dummy pattern 154e according to various embodiments may be disposed to overlap with at least part of the transmission conductive patterns 154b-1, 154b-2, and 154b-3, or may be disposed to overlap with at least part of the transmission dummy pattern 154c. In addition, at least the remaining parts of the reception dummy pattern 154e may be disposed to overlap with at least part of the flexible circuit board 154a.

The transmission conductive patterns 154b-1, 154b-2, and 154b-3 according to various embodiments may be electrically coupled to a transmitter of a digitizer sensor 1540 by means of a signal line, and the reception conductive patterns 154d-1, 154d-2, and 154d-3 may be electrically coupled to a receiver of the digitizer sensor 1540 by means of the signal line. The digitizer sensor 1540 is not necessarily limited to be disposed to the flexible circuit board 154a, and thus may be disposed to a main printed circuit board (not shown). For example, the digitizer sensor 1540 may be electrically coupled to the flexible circuit board 154a, but may not be disposed at the same position.

One end of each of the reception conductive patterns 154b-1, 154b-2, and 154b-3 and transmission conductive patterns 154d-1, 154d-2, and 154d-3 of the digitizer panel 154 according to various embodiments may be coupled to the digitizer sensor 1540, and the other end of the reception conductive patterns and transmission conductive patterns may be electrically coupled to each other through a via.

Although it is exemplified that the digitizer panel 154 according to various embodiments is constructed of a single-layer reception digitizer panel and a single-layer transmission digitizer, that is, a two-layer integrated panel in which the digitizer panels are integrated, without being limited thereto, it may also be constructed of three layers, four layers, or more. For example, it may be constructed by laminating reception and transmission digitizer panels in an orderly manner, or may be constructed by laminating reception, transmission, reception, and transmission digitizer panels in an orderly manner, or may be constructed by laminating reception, transmission, and reception digitizer panels in an orderly manner, or may be constructed by laminating transmission, reception, and transmission digitizer panels in an orderly manner.

Each of the reception and transmission digitizer panels may be disposed in directions crossing each other. For example, each of the reception digitizer panels may be disposed in a horizontal direction, and each of the transmission digitizer panels may be disposed in a vertical direction.

According to various embodiments of the present disclosure, an electronic device may include: a housing having first and second faces opposite to each other; a transparent substrate disposed on the first face of the housing; a display panel disposed below the transparent substrate; and an input sensing panel disposed below the display panel. The input sensing panel may include: a plurality of conductive patterns; and dummy patterns each disposed between each of the conductive patterns.

According to various embodiments of the present disclosure, the dummy patterns may be constructed of a non-conductive material.

According to various embodiments of the present disclosure, each of the dummy patterns may be constructed to have substantially the same thickness as that of each of the conductive patterns.

According to various embodiments of the present disclosure, each of the dummy patterns may be disposed to be co-planar with each of the conductive patterns.

According to various embodiments of the present disclosure, the transparent substrate may be constructed of a synthetic resin material.

According to various embodiments of the present disclosure, the plurality of conductive patterns may include: transmission patterns disposed with an equal interval, and each extended in a first direction; and reception patterns disposed with an equal interval, and each extended in a second direction different to the first direction.

According to various embodiments of the present disclosure, the dummy patterns may include: at least one or more transmission dummy patterns each constructed between each of the transmission patterns; and at least one or more reception dummy patterns each constructed between each of the reception patterns.

According to various embodiments of the present disclosure, the transmission dummy patterns and the reception dummy patterns may be disposed in directions crossing each other, while overlapping with each other.

According to various embodiments of the present disclosure, the display panel may include: a flat touch screen display; and a curved touch screen display disposed to an edge of the flat touch screen display.

According to various embodiments of the present disclosure, when the display panel is viewed from above, a first region having the flat touch screen display disposed thereon may have a dummy pattern constructed between each of the conductive patterns, and a second region having the curved touch screen display disposed thereon may do not have a dummy pattern constructed between each of the conductive patterns.

According to various embodiments of the present disclosure, the display panel may include any one of an LCD display panel and an OLED display panel.

According to various embodiments of the present disclosure, the input sensing panel may be a digitizer. The digitizer may include: a digitizer flexible circuit; at least one or more conductive patterns constructed on the digitizer flexible circuit; and a non-conductive pattern disposed between each of the conductive patterns.

According to various embodiments of the present disclosure, an electronic device may include: a transparent substrate constructed of a synthetic resin material; a display panel disposed to a lower face of the transparent substrate and having first and second faces facing each other; a touch screen panel disposed to the first face of the display panel; and a digitizer panel disposed to the second face of the display panel through a pressing process. The digitizer panel may include: a digitizer circuit board; at least one or more signal patterns constructed on a first face of the digitizer circuit board; and at least one non-signal patterns constructed on the first face of the digitizer circuit board, and each disposed between each of the signal patterns.

According to various embodiments of the present disclosure, each of the signal patterns may be constructed in a linear shape extended with an equal interval in a first direction, and each of the non-signal patterns may be constructed in a linear shape extended in the first direction.

According to various embodiments of the present disclosure, each of the non-signal patterns may have substantially the same thickness as that of each of the signal patterns, and each of the non-signal patterns may be disposed to be co-planar with each of the signal patterns, so that a pattern of an concavo-convex shape is not seen on the digitizer panel when the touch screen panel is seen under illumination from an upper direction.

According to various embodiments of the present disclosure, an electronic device may include: a housing including a first face facing a first direction, a second face facing a second direction opposite to the first direction, and a side face surrounding a space between the first face and the second face; a substantially transparent plate which constitutes at least part of the first face; a display layer disposed between the plate and the second face; a detection layer disposed between the display layer and the second face to detect whether an external object is in contact with or adjacent to the transparent plate by using an electromagnetic and/or magnetic change; and a processor electrically coupled to the display layer and the detection layer. The detection layer may include: a first plurality of conductive strips that has a first thickness in the first direction, and extend parallel to one another and separated from one another in a third direction perpendicular to the first direction; and at least one first pattern disposed between two adjacent conductive strips among the first plurality of conductive strips, and disposed to be substantially co-planar with the two conductive strips while having the first thickness in the first direction. The first plurality of conductive strips may be electrically coupled to the processor. The at least one first pattern may be not electrically coupled to the processor.

According to various embodiments of the present disclosure, the at least one first pattern may include as least one second strip extended separated from the two conductive strips in the third direction between the two adjacent conductive strips among the first plurality of conductive strips.

According to various embodiments of the present disclosure, the at least one second strip may include the same material as the first plurality of conductive strips.

According to various embodiments of the present disclosure, the at least one second strip and the first plurality of conductive strips may include copper.

According to various embodiments of the present disclosure, at least one of the first plurality of conductive strips may have a first width (W1) in a fourth direction perpendicular to the first direction and the third direction. The at least one second strip may be separated by a first distance (D1) in the fourth direction from the at least one of the first plurality of conductive strips, where a value of D1/W1 is in the range of 0.5 to 1.5

According to various embodiments of the present disclosure, the detection layer may further include: a second plurality of conductive strips disposed to overlap at least partially with the first plurality of conductive strips; and at least one second pattern disposed between two adjacent conductive strips among the second plurality of conductive strips, and disposed to be substantially co-planar with the two conductive strips while having the first thickness in the first direction.

The second plurality of conductive strips may be electrically coupled to the processor.

The at least one second pattern may not be electrically coupled to the processor.

Figure 16:
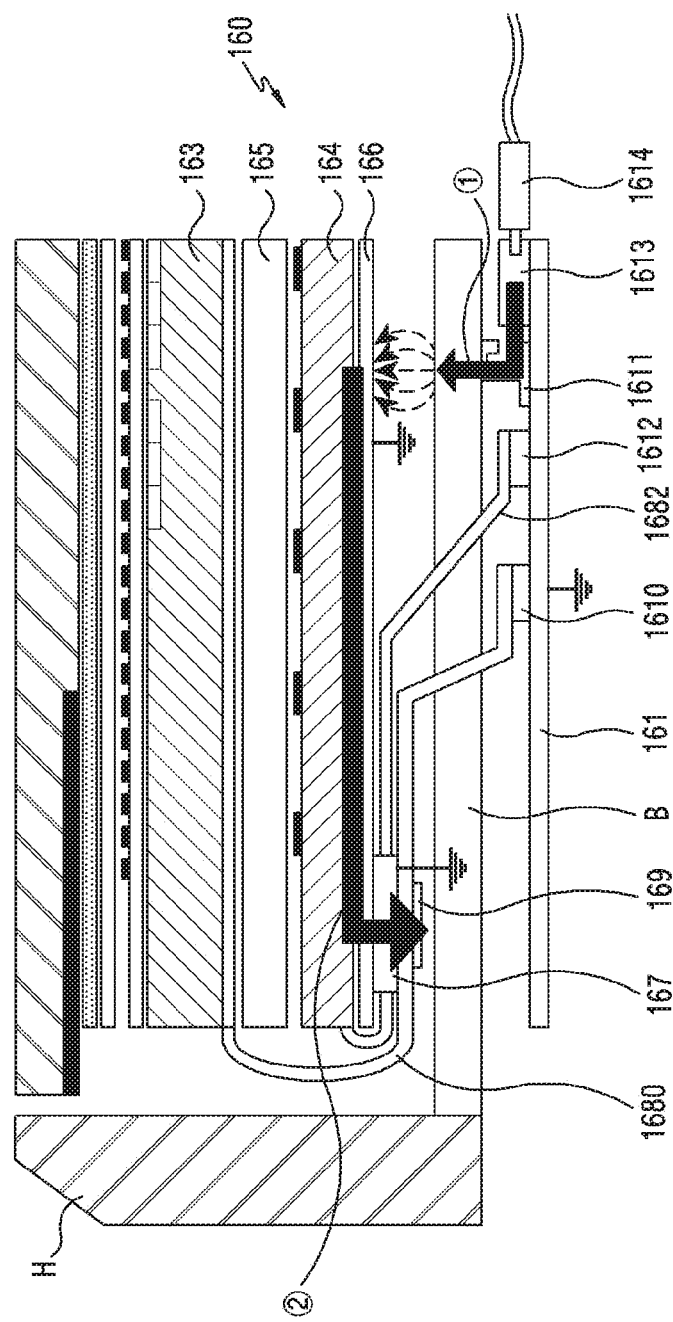
FIG. 16 is a cross-sectional view illustrating an electrical path of a noise signal of an electronic device with a copper sheet according to various embodiments.

FIG. 16 is a cross-sectional view illustrating an electrical path of a noise signal of an electronic device with a copper sheet according to various embodiments.

Referring to FIG. 16, an electronic device 160 according to various embodiments may include a housing H, a support structure B, a display panel 163, an input sensing panel 164, a printed circuit board 161, or the like.

The housing H according to various embodiments is a case which accommodates components such as the display panel 163, the substrate 161, or the like, and may be at least partially constructed of a conductive material or a non-conductive material. The housing H may be constructed of a structure in which the display panel 163, the input sensing panel 164, and the printed circuit board 161 are vertically laminated. The housing H may be coupled to the support structure B, i.e., a bracket, and the printed circuit board 161 may be fixed by means of the support structure B.

The input sensing panel 164 according to various embodiments is a detection layer, and may detect whether an external object is in contact with or adjacent to a transparent substrate (a plate or a window) by using an electromagnetic and/or magnetic change. The input sensing panel 164 may be coupled to a processor.

The electronic device 160 according to various embodiments may have a copper conductive sheet 166 mounted on a lower face of the input sensing panel 164 to shield a noise signal, static electricity, or the like.

In particular, in order to avoid a flicker phenomenon which appears on a display and occurs under the influence of charging noise generated when the electronic device 160 is charged in a wired manner, the input sensing panel 163 and the copper sheet 166 may be constructed in a structure in which a ground can be shared electrically via a conductive adhesive tape 167.

The display panel 163 according to various embodiments may be electrically coupled to the printed circuit board 161 by using a first flexible circuit board 1680 and a first slim connector 1610. The input sensing panel 164 may be electrically coupled to the printed circuit board 161 by using a second flexible circuit board 1682 and a second slim connector 1612. The printed circuit board 161 may be electrically coupled to the support structure B via an antenna connection port 1611, e.g., a C-clip.

However, when the electronic device 160 is charged, a noise signal generated by components or the like mounted on the printed circuit board 161 has an impulse waveform, and may flow (in an arrow direction ①) to the support structure B via the connection port 1161 and charging interfacing connectors 1613 and 1614 mounted on the printed circuit board. The flowing noise signal may flow to the copper sheet 166. The noise signal flowing (in an arrow direction ②) to the copper sheet 166 may be transferred to a display driving IC chip 169 mounted on the printed circuit board 161 via the conductive adhesive tape 167. The transferred noise signal may cause an erroneous operation of the chip 169, which may have an adverse effect on an output waveform of the chip. According to such a result, a damaged image may be displayed on the display panel 163.

Figure 17A:
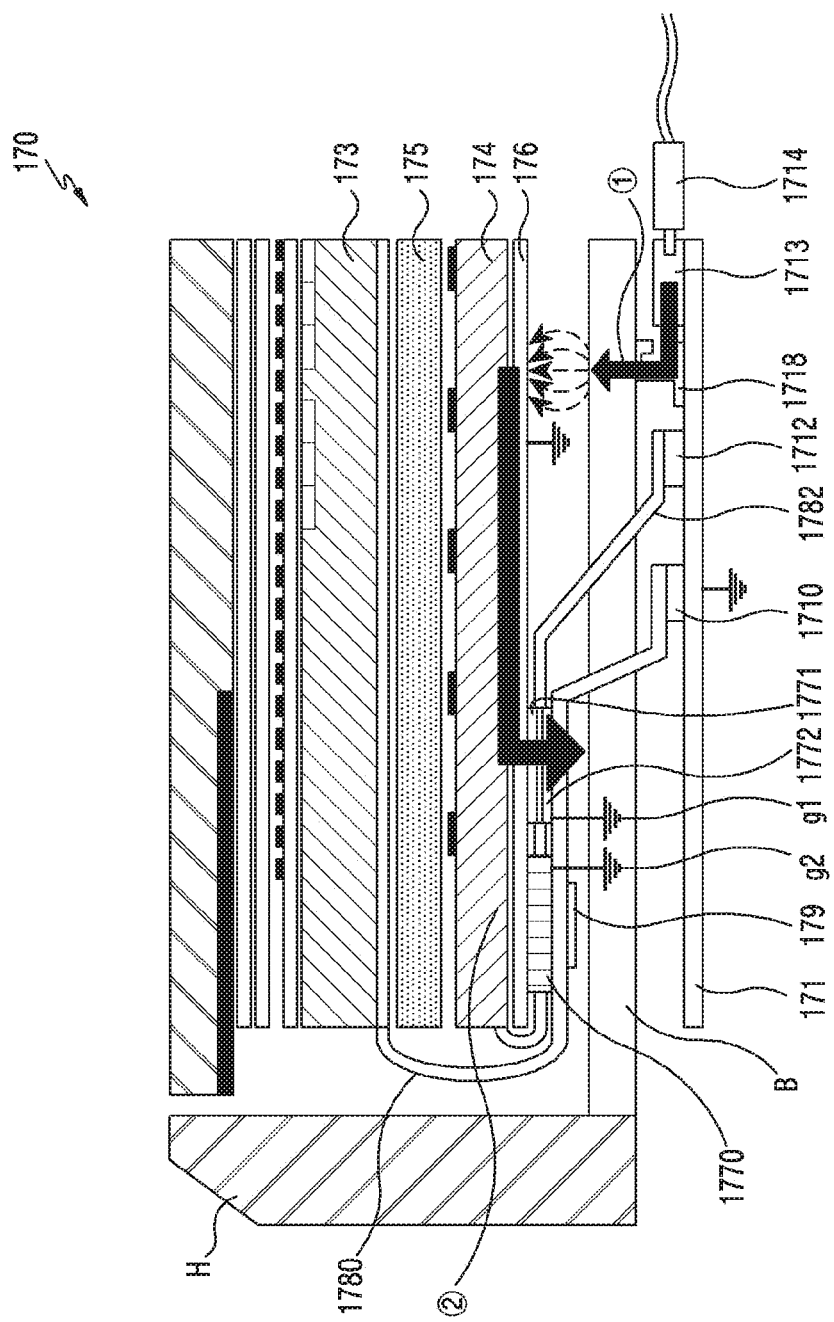
FIG. 17A is a cross-sectional view illustrating an electrical path and a ground structure in order to remove a noise signal of an electronic device with a copper sheet according to various embodiments of the present disclosure.
Figure 17B:
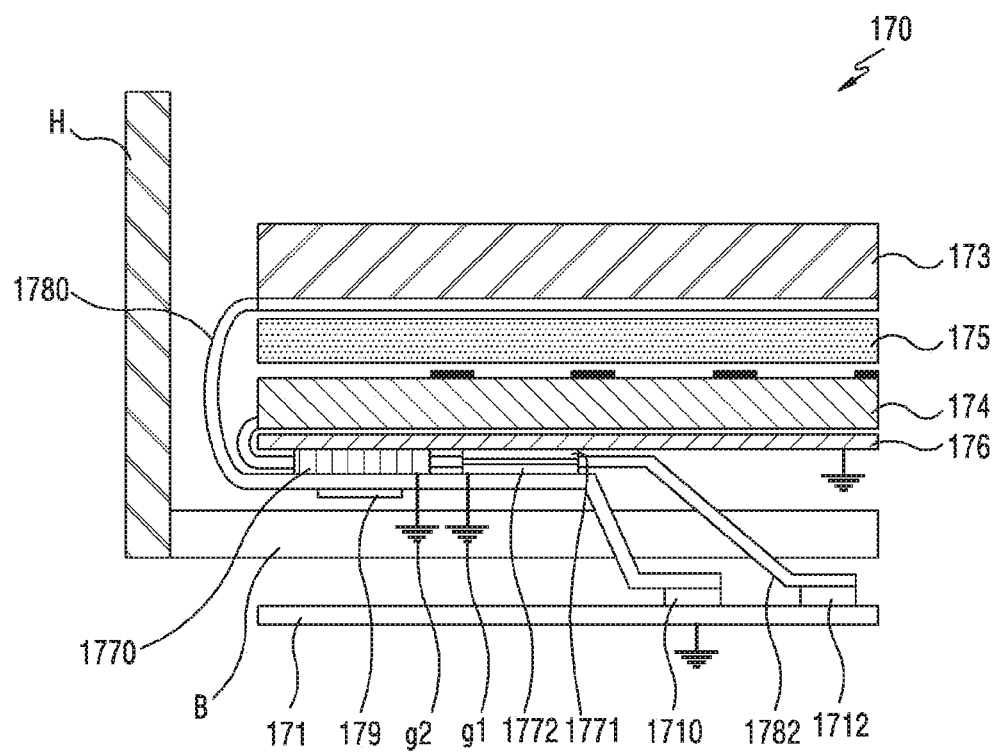
FIG. 17B is an enlarged view illustrating an important portion of FIG. 17A.

FIG. 17A is a cross-sectional view illustrating an electrical path and a ground structure in order to remove a noise signal of an electronic device with a copper sheet according to various embodiments of the present disclosure. FIG. 17B is an enlarged view illustrating an important portion of FIG. 17A.

Referring to FIG. 17A and FIG. 17B, an electronic device 170 according to various embodiments of the present disclosure may include a housing H, a support structure B, a display panel 173, an input sensing panel 174, a conductive sheet 176, a printed circuit board 171, a ground connection structure, or the like.

The housing H according to various embodiments is a case which accommodates components such as the display panel 173, the substrate 171, or the like, and may be at least partially constructed of a conductive material or a non-conductive material. For example, the housing H may include a first face facing a first direction, a second face facing a second direction opposite to the first direction, and a side face surrounding a space between the first and second faces. The housing H may be constructed of a structure in which the display panel 173, the input sensing panel 174, and the printed circuit board 171 are vertically laminated. The housing H may be coupled to the support structure B, i.e., a bracket, and the printed circuit board 171 and the display panel 173 may be fixed by means of the support structure B. The support structure B according to various embodiments may be at least partially constructed of a non-conductive material, or may be coupled to the housing H as a member at least partially including a conductive material.

The electronic device 170 according to various embodiments may mount a conductive sheet, e.g., the copper sheet 176, on a lower face of the input sensing panel 174 to protect various components from a noise signal, static electricity, or the like. For example, the input sensing panel may be a digitizer. The copper sheet 176 may be disposed between the display panel 173 and a second face of the housing H.

The display panel 173 according to various embodiments may be electrically coupled to the printed circuit board 171 by using a first flexible circuit board 1780 and a first slim connector 1710. The input sensing panel 174 may be electrically coupled to the printed circuit board 171 by using a second flexible circuit board 1782 and a second slim connector 1712. The printed circuit board 171 may be electrically coupled to the support structure B via an antenna connection port 1711, e.g., a C-clip. Each of the first and second flexible circuit boards 1780 and 1782 may be disposed between the copper sheet 176 and the second face of the housing.

The support structure B according to various embodiments may be disposed between the first and second flexible circuit boards 1780 and 1782 and the second face of the housing H. The support structure B may be referred to as a mid-plate.

The printed circuit board 171 according to various embodiments may be disposed between the support structure B and the second face of the housing H, may have at least one IC mounted thereon, and may be at least partially constructed of a ground plane.

In order to prevent a noise signal generated during wired charging from flowing to a display driver IC chip 179 (hereinafter, a display chip), the electronic device 170 constructed of the aforementioned structure may provide a noise signal electrical connection path as follows.

The electronic device 170 according to various embodiments may include a non-conductive member 1770 which cuts off an electrical path between the copper sheet 176 and a first portion of the first flexible circuit board 1780 having the display chip 179 mounted thereon, a first conductive coupling member 1771 which electrically couples the copper sheet 176 and a second portion of a second flexible circuit board 1782 adjacent to the display chip 179, and a second conductive coupling member 1772 which electrically couples a first portion of the second flexible circuit board 1782 electrically coupled by the first conductive coupling member 1771 and a second portion of the first flexible circuit board 1780. For example, the non-conductive member 1770 may include a non-conductive tape, and each of the first and second conductive coupling members 1771 and 1772 may include a conductive tape. Each of the non-conductive member 1770 and the first and second conductive members 1771 and 1772 may be attached as an adhesive tape.

The electronic device 170 according to various embodiments may include a first ground portion g1 which grounds the second portion of the first flexible circuit board 1780 having first and second conductive members and a second ground portion g2 which grounds the first portion of the first flexible circuit board 1780 at which the display chip 179 is located. An electrical path may be provided for a noise signal flowing to the copper sheet 176 via the support structure B in arrow directions ① and ②, so that the signal flows to the first ground portion g1 by means of the first and second conductive members 1771 and 1772. The electrical path for the noise signal flowing from the copper sheet 176 is cut off by the non-conductive member 1770, thereby cutting off the electrical path through which the noise signal flows to the display chip 179.

The non-conductive member 1770 and the first and second conductive members 1771 and 1772 according to various embodiments may be disposed adjacent to each other, and for example, may be located at a place adjacent to the display chip 179.

The first flexible printed circuit board 1780 according to various embodiments may include at least part of a first conductive path which electrically couples the copper sheet 176 and the ground plane of the printed circuit board 171 and at least part of a second conductive path electrically separated from the first conductive path on the first flexible circuit board 1780 while electrically coupling an electric circuit and the ground plane.

Figure 18:
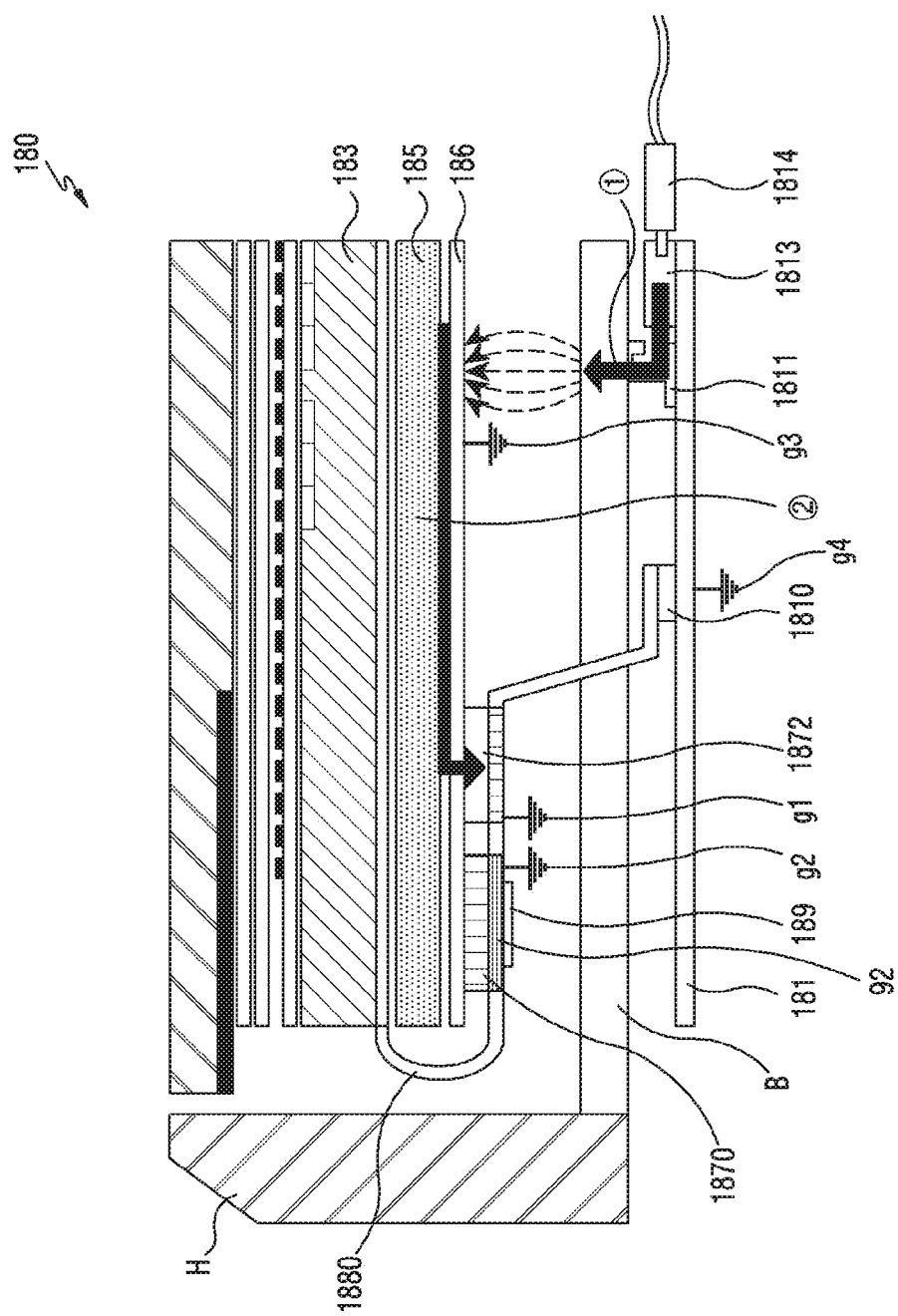
FIG. 18 is a cross-sectional view illustrating an electrical path and a ground structure in order to remove a noise signal of an electronic device with a copper sheet according to various embodiments of the present disclosure.

FIG. 18 is a cross-sectional view illustrating an electrical path and a ground structure in order to remove a noise signal of an electronic device with a copper sheet according to various embodiments of the present disclosure.

Referring to FIG. 18, an electronic device 180 according to various embodiments has the same configuration as the electronic device 170 of FIG. 17 except that an input sensing panel, an input sensing flexible circuit board for electrically coupling the input sensing panel to a printed circuit board, and a slim connector for joining an end portion of the input sensing flexible circuit board to the printed circuit board are excluded, and thus detailed descriptions thereof will be omitted.

The electronic device 180 according to various embodiments may use a non-conductive member 1870 to couple a copper sheet 186 and a first portion of a display flexible circuit board 1880 having a display chip 189 mounted thereon, and may use a conductive member 1872 to couple the copper sheet 186 and a second portion of the display flexible circuit board 1870 adjacent to the display chip 189. An electrical path between the copper sheet 186 and the first portion may be cut off by the non-conductive member 1870, and an electrical path may be established between the copper sheet 186 and the second portion. A noise signal flowing to the copper sheet 186 may be grounded by the established electrical path via the conductive member 1872.

The electronic device 180 according to various embodiments may include a first ground portion g1 which grounds the first portion coupled with the conductive member 1872 and a second ground portion g2 which grounds the first portion of the display flexible circuit board 1880 at which the display chip 189 is located.

An electrical path may be provided for a noise signal flowing to the copper sheet 186 in arrow directions ① and ②, so that the signal flows to the first ground portion g1 by means of the conductive member 1872. The electrical path for the noise signal flowing from the copper sheet 186 is cut off by the non-conductive member 1870, thereby cutting off the electrical path through which the noise signal flows to the display chip 189. The non-conductive member 1870 and conductive member 1872 according to various embodiments may be located adjacent to each other, for example, may be located at a place adjacent to the display chip 189. A reference numeral 185 may be a cushion layer.

The first ground portion and the second ground portion may be electrically coupled to a ground g4 of a printed circuit board 181 by means of a connector 1810. g3 may be a ground portion coupled with the copper sheet 186. The first and second ground portions g1 and g2 may be coupled to another ground, whereas the first ground portion g1 and the ground portions g3 and g4 respectively coupled to the copper sheet and the printed circuit board may be constructed as the same ground portion.

Figure 19:
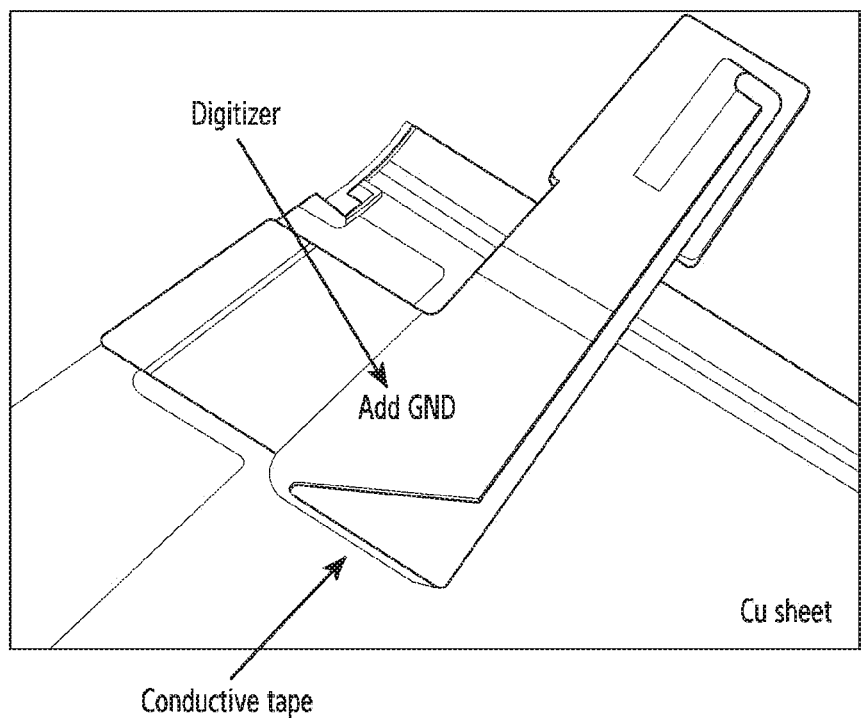
FIG. 19 illustrates part of an electronic device which uses first and second conductive tapes in the digitizer flexible circuit board of FIG. 17.
Figure 20:
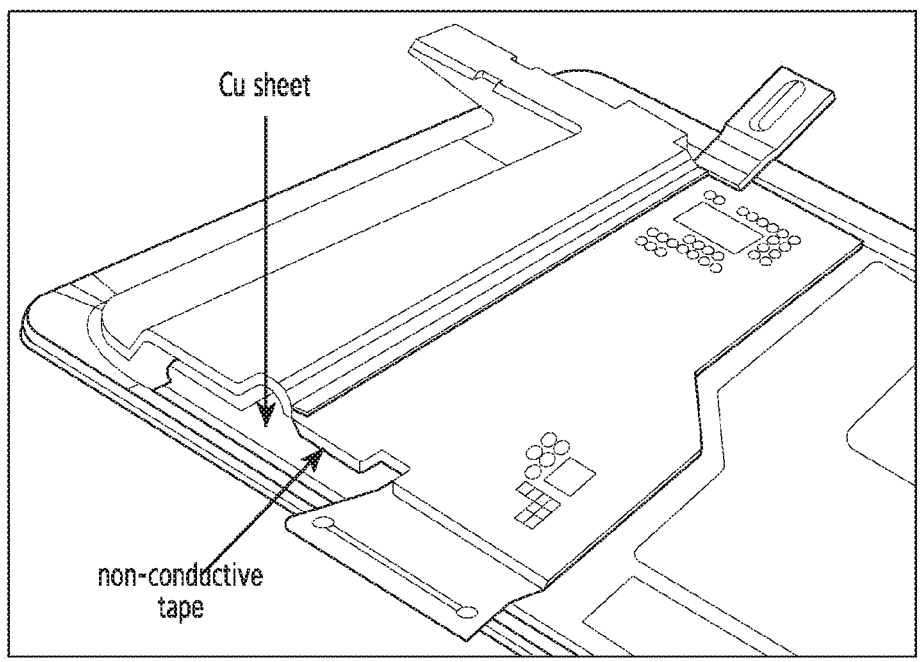
FIG. 20 illustrates part of an electronic device which uses a non-conductive tape in the display flexible circuit board of FIG. 18.

FIG. 19 illustrates part of an electronic device which uses first and second conductive tapes in the digitizer flexible circuit board of FIG. 17. FIG. 20 illustrates part of an electronic device which uses a non-conductive tape in the display flexible circuit board of FIG. 18.

The term "module," as used herein may represent, for example, a unit including a combination of one or two or more of hardware, software, or firmware. The "module" may be, for example, used interchangeably with the terms "unit", "logic", "logical block", "component", or "circuit" etc. The "module" may be the minimum unit of an integrally constructed component or a part thereof. The "module" may be also the minimum unit performing one or more functions or a part thereof. The "module" may be implemented mechanically or electronically. For example, the "module" may include at least one of an application-specific integrated circuit (ASIC) chip, Field-Programmable Gate Arrays (FPGAs) and a programmable-logic device performing some operations known to the art or to be developed in the future.

At least a part of an apparatus (e.g., modules or functions thereof) or method (e.g., operations) according to the present invention may be, for example, implemented as instructions stored in a computer-readable storage medium in a form of a programming module. In case that the instruction is executed by a processor (e.g., processor 120), and the processor may perform functions corresponding to the instructions. The computer-readable storage media may be the memory 130, for instance.

The computer-readable recording medium may include a hard disk, a floppy disk, and a magnetic medium (e.g., a magnetic tape), an optical medium (e.g., a Compact Disc-Read Only Memory (CD-ROM) and a Digital Versatile Disc (DVD)), a Magneto-Optical Medium (e.g., a floptical disk), and a hardware device (e.g., a Read Only Memory (ROM), a Random Access Memory (RAM), a flash memory, etc.). Also, the program instruction may include not only a mechanical language code such as a code made by a compiler but also a high-level language code executable by a computer using an interpreter, etc. The aforementioned hardware device may be constructed to operate as one or more software modules in order to perform operations of the present invention, and vice versa.

The module or programming module according to the present invention may include at least one or more of the aforementioned constituent elements, or omit some of the aforementioned constituent elements, or further include additional other constituent elements. Operations carried out by the module, the programming module or the other constituent elements according to the present invention may be executed in a sequential, parallel, repeated or heuristic method. Also, some operations may be executed in different order or may be omitted, or other operations may be added.

Meanwhile, the exemplary embodiments disclosed in the specification and drawings are merely presented to easily describe the technical contents of the present disclosure and help with the understanding of the present disclosure and are not intended to limit the scope of the present disclosure. Therefore, all changes or modifications derived from the technical idea of the present disclosure as well as the embodiments described herein should be interpreted to belong to the scope of the present disclosure.

The invention claimed is:

1. An electronic device comprising:
   a transparent substrate; a display panel disposed below the transparent substrate;
   a touch screen panel disposed on the display panel;
   a digitizer panel disposed below the display panel; and
   a cushion layer disposed between the display panel and the digitizer panel,
   wherein the digitizer panel is adhered to a lower face of the cushion layer,
   wherein the digitizer panel comprises:
      a plurality of conductive patterns,
      dummy patterns each disposed between each of the conductive patterns,
   wherein the plurality of conductive patterns comprise:
      first patterns disposed with an equal interval, and each extended in a first direction, and
      second patterns disposed with an equal interval, and each extended in a second direction different to the first direction,
   wherein the first patterns are transmission patterns and the second patterns are reception patterns,
   wherein the dummy patterns comprise:
      at least two or more first dummy patterns each constructed between each of the first patterns, and
      at least one or more second dummy patterns each constructed between each of the second patterns,
   wherein each of the at least two or more first dummy patterns is constructed to have substantially the same thickness as that of each of the first patterns,
   wherein each of the at least two or more first dummy patterns is disposed to be co-planar with each of the first patterns,
   wherein the touch screen panel comprises:
      a flat touch screen; and
      a curved touch screen disposed to an edge of the flat touch screen; and
   wherein when the touch screen panel is viewed from above, a first region of the digitizer on which the flat touch screen is disposed has a dummy pattern constructed between each of the conductive patterns, and a second region of the digitizer panel on which the curved touch screen is disposed has at least one of the conductive patterns and does not have a dummy pattern constructed between each of the conductive patterns.

2. The electronic device of claim 1, wherein the dummy patterns are constructed of a non-conductive material.

3. The electronic device of claim 1, wherein the transparent substrate is constructed of a synthetic resin material.

4. The electronic device of claim 1, wherein the at least two or more first dummy patterns and the at least one or more second dummy patterns are disposed in direction crossing each other, while overlapping with each other overlapping with each other.

5. The electronic device of claim 1, wherein the display panel comprises any one of a Liquid Crystal Display (LCD) display panel and an Organic Light Emitting Diode (OLED) display panel,
   wherein the digitizer panel comprises:
      a digitizer flexible circuit;
      at least one or more conductive patterns constructed on the digitizer flexible circuit; and
      a dummy pattern disposed between each of the conductive patterns.

6. An electronic device comprising:
   a transparent substrate;
   a display panel disposed to a lower face of the transparent substrate and having first and second faces facing each other;
   a touch screen panel disposed to the first face of the display panel; and including a flat touch screen and a curved touch screen disposed to an edge of the flat touch screen;
   a digitizer panel disposed to the second face of the display panel; and
   a cushion layer disposed between the display panel and the digitizer panel,
   wherein the digitizer panel is adhered to a lower face of the cushion layer,
   wherein the digitizer panel comprises:
      a digitizer circuit board;
      at least one or more first signal patterns constructed on a first face of the digitizer circuit board;
      at least one or more second signal patterns disposed to overlap at least partially with the one or more first signal patterns; and
      at least one non-signal pattern constructed on the first face of the digitizer circuit board, and each disposed between each of the first signal patterns,
   wherein each of the non-signal patterns has substantially the same thickness as that of each of the first signal patterns, and each of the non-signal patterns is disposed to be co-planar with each of the first signal patterns, and
   wherein the at least one non-signal pattern is not electrically coupled to the digitizer circuit board.

7. The electronic device of claim 6, wherein each of the one or more first signal patterns and the one or more second signal patterns is constructed in a linear shape extended with an equal interval.

8. An electronic device comprising:
   a housing comprising a first face facing a first direction, a second face facing a second direction opposite to the first direction, and a side face surrounding a space between the first face and the second face;
   a substantially transparent plate which constitutes at least part of the first face;
   a display layer disposed between the transparent plate and the second face;
   a detection layer disposed between the display layer and the second face to detect whether an external object is in contact with or adjacent to the transparent plate by using an electromagnetic and/or magnetic change;
   a cushion layer disposed between the display layer and the detection layer; and
   a processor electrically coupled to the display layer and the detection layer,
   wherein the detection layer is adhered to a lower face of the cushion layer,
   wherein the detection layer comprises:
      a first plurality of conductive strips that have a first thickness in the first direction, and extend parallel to one another and separated from one another in a third direction perpendicular to the first direction; and
      at least one first pattern disposed between two adjacent conductive strips among the first plurality of conductive strips, and disposed to be substantially co-planar with the two adjacent conductive strips among the first plurality of conductive strips while having the first thickness in the first direction,
   wherein the first plurality of conductive strips are electrically coupled to the processor,
   wherein the at least one first pattern is not electrically coupled to the processor, wherein the detection layer further comprises:
- a second plurality of conductive strips disposed to overlap at least partially with the first plurality of conductive strips; and
- at least one second pattern disposed between two adjacent conductive strips among the second plurality of conductive strips, and disposed to be substantially co-planar with the two adjacent conductive strips among the second plurality of conductive strips while having the first thickness in the first direction, wherein the second plurality of conductive strips are electrically coupled to the processor, and wherein the at least one second pattern is not electrically coupled to the processor.

9. The electronic device of claim 8, wherein the at least one first pattern comprises at least one dummy strip extended separated from the two adjacent conductive strips among the first plurality of conductive strips in the third direction between the two adjacent conductive strips among the first plurality of conductive strips.

10. The electronic device of claim 8, wherein the at least one dummy strip comprises the same material as the first plurality of conductive strips,
wherein the at least one dummy strip and the first plurality of conductive strips comprise copper.

11. The electronic device of claim 8,
wherein at least one of the first plurality of conductive strips has a first width (W1) in a fourth direction perpendicular to the first direction and the third direction, and
wherein at least one dummy strip is separated by a first distance (D1) in the fourth direction from the at least one of the first plurality of conductive strips, where a value of D1/W1 is in the range of 0.5 to 1.5.

* * * * *